(12) United States Patent
Takahashi et al.

(10) Patent No.: US 10,483,301 B2
(45) Date of Patent: *Nov. 19, 2019

(54) IMAGING APPARATUS AND IMAGING SYSTEM

(71) Applicant: CANON KABUSHIKI KAISHA, Tokyo (JP)

(72) Inventors: Hidekazu Takahashi, Zama (JP); Kazuaki Tashiro, Isehara (JP); Tatsuhito Goden, Machida (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/364,103

(22) Filed: Nov. 29, 2016

(65) Prior Publication Data

US 2017/0162617 A1  Jun. 8, 2017

(30) Foreign Application Priority Data

Dec. 4, 2015 (JP) .................. 2015-237869
Aug. 5, 2016 (JP) .................. 2016-154616

(51) Int. Cl.
*H01L 27/146* (2006.01)
*H04N 5/378* (2011.01)
*H04N 5/3745* (2011.01)
*H04N 5/359* (2011.01)
*H04N 5/363* (2011.01)

(52) U.S. Cl.
CPC .... *H01L 27/14605* (2013.01); *H01L 27/1464* (2013.01); *H01L 27/14621* (2013.01); *H01L 27/14627* (2013.01); *H01L 27/14636* (2013.01); *H01L 27/14641* (2013.01); *H01L 27/14645* (2013.01); *H04N 5/378* (2013.01); *H04N 5/3745* (2013.01); *H04N 5/3597* (2013.01); *H04N 5/363* (2013.01)

(58) Field of Classification Search
CPC ......... H01L 27/14605; H01L 27/14609; H01L 27/14623; H01L 27/14627; H01L 27/14665

See application file for complete search history.

(56) References Cited

U.S. PATENT DOCUMENTS

| 8,723,284 | B1 | 5/2014 | Hynecek |
| 2007/0018075 | A1 | 1/2007 | Cazaux |
| 2008/0224053 | A1* | 9/2008 | Shen ............... G01T 1/2018 250/369 |
| 2012/0080726 | A1 | 4/2012 | Sakano |

(Continued)

FOREIGN PATENT DOCUMENTS

| EP | 0757476 A2 | 2/1997 |
| JP | 2013-247387 A | 12/2013 |
| WO | 2012/004923 A1 | 1/2012 |

*Primary Examiner* — Phat X Cao
(74) *Attorney, Agent, or Firm* — Canon U.S.A., Inc. IP Division

(57) ABSTRACT

An imaging apparatus according to the present invention includes a substrate including a plurality of pixel circuits arranged thereon and a semiconductor layer disposed on the substrate. Each of the plurality of pixel circuits includes an amplification transistor configured to output a signal based on charge generated in the semiconductor layer. The charge generated in the semiconductor layer is transferred in a first direction parallel to a surface of the substrate.

21 Claims, 19 Drawing Sheets

(56) References Cited

U.S. PATENT DOCUMENTS

| | | |
|---|---|---|
| 2012/0085888 A1 | 4/2012 | Endo |
| 2012/0205730 A1 | 8/2012 | Chen |
| 2013/0221194 A1 | 8/2013 | Manabe |
| 2013/0256544 A1 | 10/2013 | Senda |
| 2014/0085523 A1 | 3/2014 | Hynecek |
| 2015/0108598 A1 | 4/2015 | Kambe |
| 2016/0119562 A1* | 4/2016 | Takase .............. H01L 27/14667 348/230.1 |

* cited by examiner

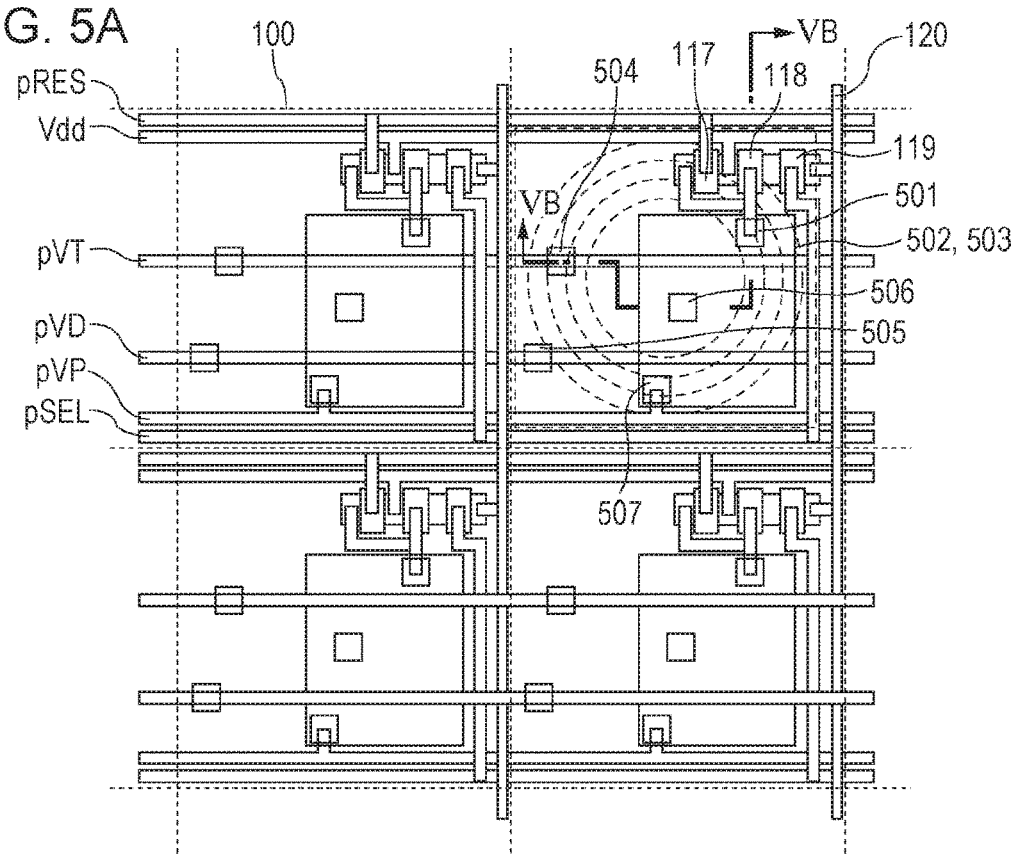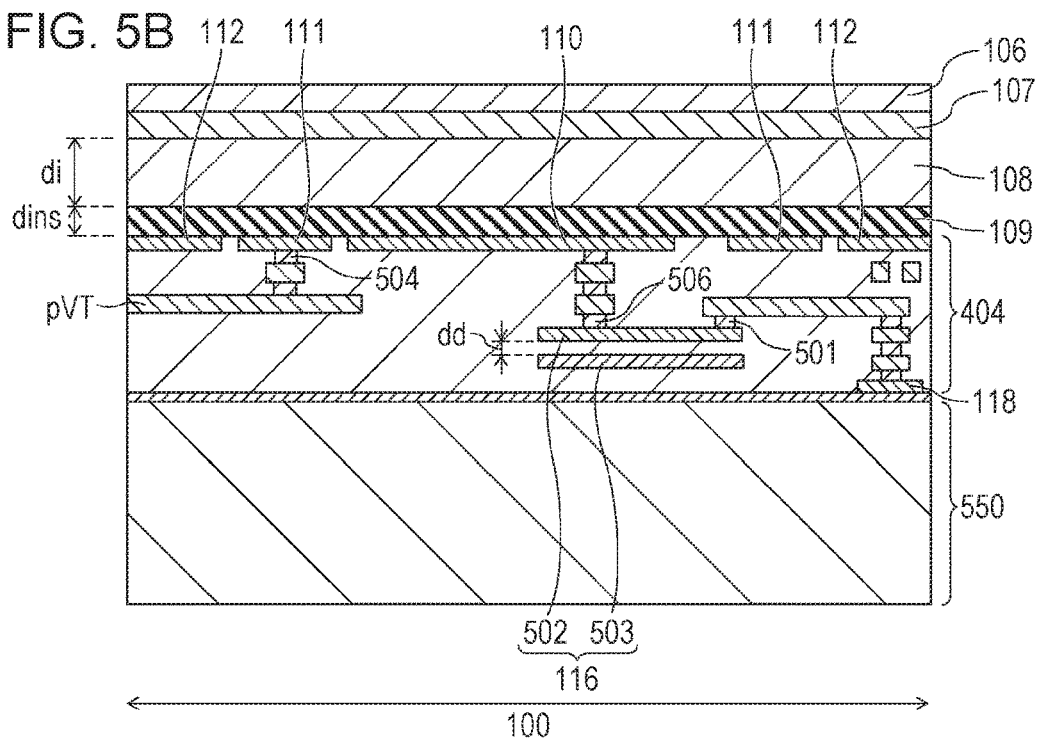

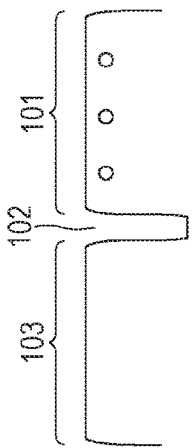 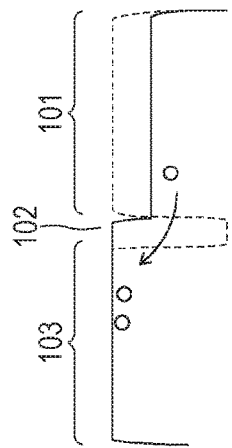 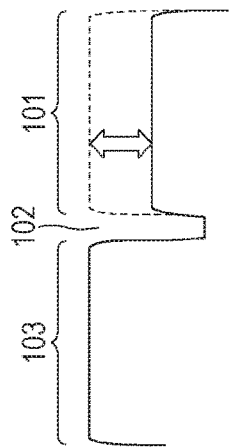
FIG. 6D  FIG. 6E  FIG. 6F
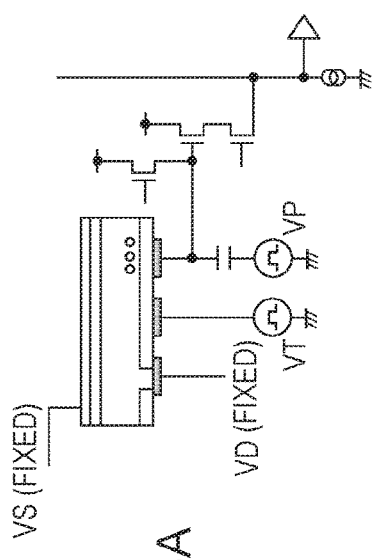 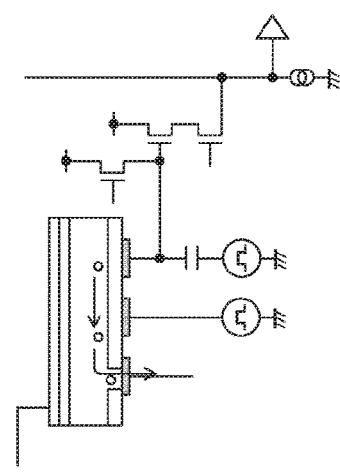 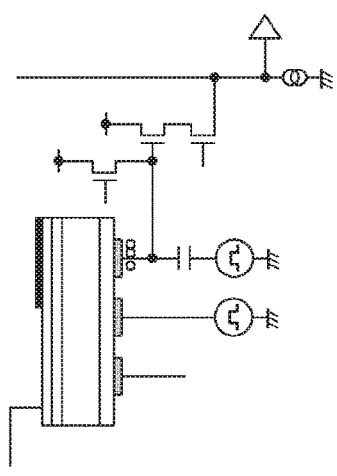
FIG. 6A  FIG. 6B  FIG. 6C

IMAGING APPARATUS AND IMAGING
SYSTEM

BACKGROUND OF THE INVENTION

Field of the Invention

The present invention relates to an imaging apparatus and an imaging system.

Description of the Related Art

Lamination type imaging apparatuses have been proposed as an imaging apparatus used for an image sensor of a camera. In an imaging apparatus illustrated in FIG. 1 of International Publication No. 2012/004923, a photoelectric conversion film is disposed on a semiconductor substrate. A transparent electrode is disposed on the photoelectric conversion film, and a pixel electrode is disposed between the photoelectric conversion film and the semiconductor substrate. An insulating film is disposed between the photoelectric conversion film and the pixel electrode. According to International Publication No. 2012/004923, since correlated double sampling (CDS) is enabled with this configuration, noise may be reduced.

SUMMARY OF THE INVENTION

According to an aspect of the present invention, an imaging apparatus includes a substrate including a plurality of pixel circuits and a semiconductor layer disposed on the substrate. Each of the plurality of pixel circuits includes an amplification transistor configured to output a signal based on charge generated in the semiconductor layer. The charge generated in the semiconductor layer is transferred in a first direction parallel to a surface of the substrate.

Further features of the present invention will become apparent from the following description of exemplary embodiments with reference to the attached drawings.

BRIEF DESCRIPTION OF THE DRAWINGS

FIG. 5A is a diagram schematically illustrating a planer structure of the imaging apparatus, and FIG. 5B is a diagram schematically illustrating a sectional structure of the imaging apparatus.

FIGS. 6A to 6C are diagrams schematically illustrating a configuration of a pixel of the imaging apparatus, and FIGS. 6D to 6F are diagrams schematically illustrating a potential of the imaging apparatus.

DESCRIPTION OF THE EMBODIMENTS

Figure 1A:
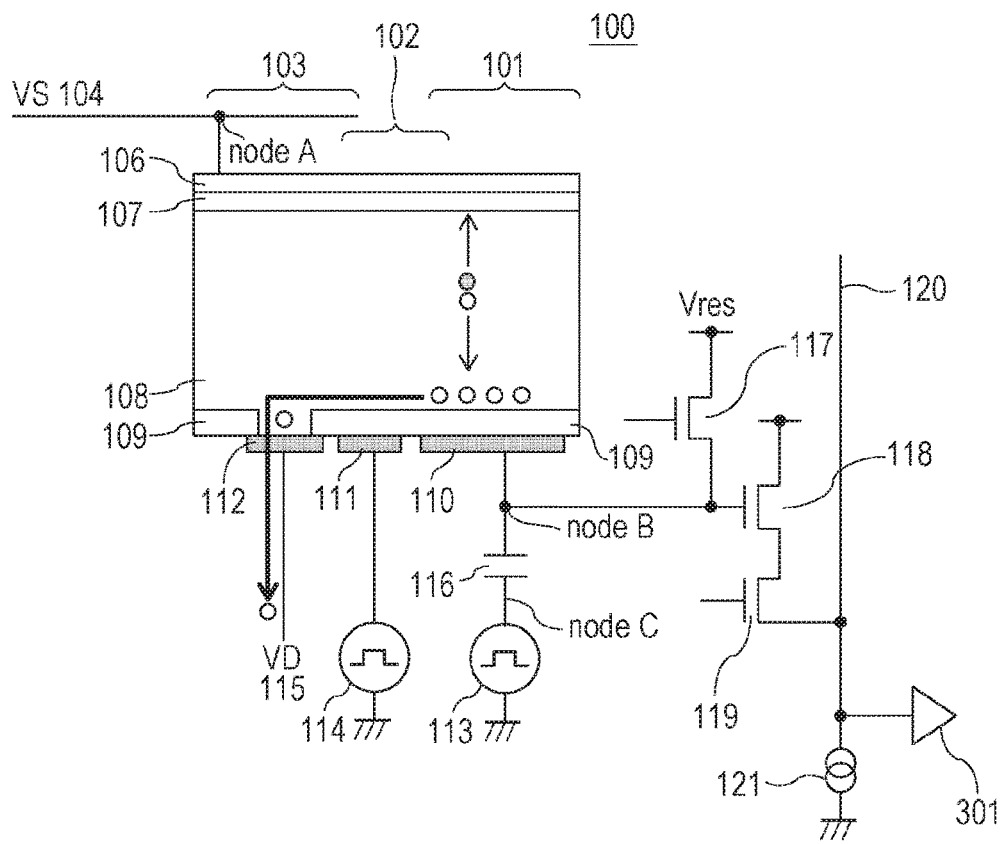
FIG. 1A is a diagram schematically illustrating a configuration of a pixel of an imaging apparatus.

In imaging apparatuses, charge accumulated in an interface formed between a photoelectric conversion film and an oxide film is discharged to an upper electrode at high speed so that a high S/N ratio is obtained. However, a charge movement degree in the photoelectric conversion film is low. Furthermore, a defect level which traps charge is included in the photoelectric conversion film. Moreover, a potential barrier exists between the photoelectric conversion film and a blocking layer. Therefore, in an imaging apparatus using the photoelectric conversion film, charge may not be sufficiently discharged in a short transfer period. As a result, sensitivity may be deteriorated or noise may be increased. According to some embodiments, noise may be reduced.

According to an embodiment of the present invention, an imaging apparatus includes a plurality of pixels. Each of the pixels includes a photoelectric conversion unit and a pixel circuit used to read a signal based on charge generated in the photoelectric conversion unit. The imaging apparatus of this embodiment includes a substrate including the pixel circuits arranged thereon and a semiconductor layer disposed on the substrate. Each of the pixel circuits includes an amplification transistor which outputs a signal based on charge generated in the semiconductor layer. The charge generated in the semiconductor layer is transferred in a first direction in the semiconductor layer. The first direction is parallel to a surface of the substrate including the pixel circuit disposed thereon.

The surface of the substrate is an interface between a semiconductor region and an insulator region disposed on the semiconductor region, for example. In a case where an insulator isolation structure using shallow trench isolation (STI) or local oxidation of silicon (LOCOS) is used, the interface between the semiconductor region and the insulator region is not flat. In this case, the interface between the semiconductor region and the insulator region in a channel of a transistor disposed on the substrate, for example, corresponds to the surface of the substrate.

With this configuration, instead of charge transfer to the upper electrode (vertical transfer), charge transfer along the interface of the semiconductor layer (lateral transfer) is performed. Therefore, as a transfer path of charge, an interface between a semiconductor layer and an insulating layer, an interface between a blocking layer and an insulating layer, an interface between a semiconductor layer and a blocking layer, or the like may be used. These interfaces only have a small defect level, and therefore, charge is transferred at high speed.

Furthermore, to obtain sufficient sensitivity for light having a long wavelength, the semiconductor layer in which photoelectric conversion is performed has a large thickness. Therefore, in a case where the vertical transfer is performed, charge is transferred in a long distance. On the other hand, in a case where the lateral transfer is performed, charge may be transferred in a short distance. This is because a distance between a first portion which is a transfer source in the semiconductor layer and a second portion which is a transfer destination in the semiconductor layer is not restricted by sensitivity for light having a long wavelength or the like.

In this way, according to the imaging apparatus of this embodiment, the charge may be efficiently transferred. Therefore, noise of an image lag or the like caused by residual charge may be reduced.

Hereinafter, embodiments of the present invention will be described in detail with reference to the accompanying drawings. The present invention is not limited to the embodiments described below. Modifications obtained by changing a portion of a configuration of the embodiments described below are also included in the present invention within the scope of the present invention. Alternatively, an example in which a portion of the configurations of the embodiments is added to one of the other embodiments and an example in which a portion of the configurations of the embodiments is replaced by a portion of a configuration of one of the other embodiments are also included in the present invention.

First Embodiment

A first embodiment of the present invention will now be described. FIG. 1A is a diagram schematically illustrating a pixel 100 of an imaging apparatus according to the first embodiment. The imaging apparatus includes a substrate (not illustrated) including a pixel circuit of the pixel 100 disposed thereon and a semiconductor layer 108 disposed on the substrate. Although only one pixel 100 is illustrated in FIG. 1A, the imaging apparatus of this embodiment includes a plurality of pixels 100.

The pixel 100 includes a light receiving region 101, a charge transfer region 102, and a charge discharging region 103 which are included in the semiconductor layer 108. The light receiving region 101 is a first portion of the semiconductor layer 108, and the charge discharging region 103 is a second portion of the semiconductor layer 108. The semiconductor layer 108 may be formed of an inorganic semiconductor, such as silicon. Alternatively, the semiconductor layer 108 may be formed of an organic semiconductor.

An upper electrode S 106 which applies a bias voltage to the light receiving region 101, the charge transfer region 102, and the charge discharging region 103 is disposed over the semiconductor layer 108. The upper electrode S 106 is connected to a power source VS 104. The power source VS 104 supplies a voltage Vs. In this embodiment, the upper electrode S 106 applies the bias voltage to both of the light receiving region 101 and the charge discharging region 103. Therefore, the upper electrode S 106 is constituted by a conductive layer which continuously extends on the light receiving region 101 and the charge discharging region 103. In other words, a first portion (a first electrode) of the upper electrode S 106 applies a bias voltage to the light receiving region 101, and a second portion (a third electrode) of the upper electrode S 106 applies a bias voltage to the charge discharging region 103. Note that the first portion (the first electrode) and the second portion (the third electrode) of the upper electrode S 106 may be separated from each other.

The pixel 100 further includes an electrode P (a second electrode) 110 which applies a bias voltage to the light receiving region 101 and includes a power source VP 113 which is connected to the electrode P 110 through a first capacitor Cm 116. The power source VP 113 supplies a plurality of voltages Vp including a first voltage and a second voltage which is different from the first voltage. The pixel 100 further includes an electrode D (a fourth electrode) 112 which applies a bias voltage to the charge discharging region 103. The light receiving region 101 of the semiconductor layer 108 is disposed between the first portion (the first electrode) of the upper electrode S 106 and the electrode P 110. The charge discharging region 103 of the semiconductor layer 108 is disposed between the second portion (the third electrode) of the upper electrode S 106 and the electrode D 112. The electrode D 112 is disposed adjacent to the charge discharging region 103 of the semiconductor layer 108.

The electrode P 110 is electrically separated from the electrode D 112. With this configuration, the light receiving region 101 and the charge discharging region 103 may independently apply bias voltages.

The upper electrode S 106 allows a certain amount of light to pass. An indium tin oxide (ITO) layer which is a transparent conductive material or a thin metal layer, for example, is used as the upper electrode S 106.

A blocking layer 107 which reduces intrusion of charge from the upper electrode S 106 to the semiconductor layer 108 is disposed between the upper electrode S 106 and the semiconductor layer 108. The blocking layer 107 prevents holes from intruding into the semiconductor layer 108. Therefore, the blocking layer 107 may be referred to as a "hole blocking layer". The blocking layer 107 may be formed of a material having a band gap which is different from that of the semiconductor layer 108. Alternatively, the blocking layer 107 may be formed of a material having an impurity concentration different from that of the semiconductor layer 108. An insulating layer 109 is disposed between the electrode P 110 and the semiconductor layer 108. The insulating layer 109 further extends in a portion between a portion of the electrode D 112 and the semiconductor layer 108 and a portion between a transfer electrode T 111 and the semiconductor layer 108. Note that, as a modification of this embodiment, at least one of the blocking layer 107 and the insulating layer 109 is omitted.

The charge transfer region 102 is disposed between the light receiving region 101 and the charge discharging region 103. The pixel 100 includes the transfer electrode T 111 which controls a bias voltage to be applied to the charge transfer region 102 and a power source VT 114 connected to the transfer electrode T 111. The power source VT 114 supplies a voltage Vt. As a modification of this embodiment, the charge transfer region 102 and the transfer electrode T 111 are omitted.

A voltage Vm is supplied from the power source VP 113 to the electrode P 110 through the first capacitor Cm 116. The pixel 100 includes a reset transistor 117 connected to the electrode P 110 and an amplification transistor 118. The pixel 100 further includes a selection transistor 119 disposed in an electric path between the amplification transistor 118 and an output line 120. The reset transistor 117, the amplification transistor 118, and the selection transistor 119 are examples of elements included in the pixel circuit. The amplification transistor 118 outputs a signal based on charge generated in the light receiving region 101. The reset transistor 117 resets a voltage of an input node of the amplification transistor 118. The selection transistor 119 controls connection between the amplification transistor 118 and the output line 120. A plurality of pixels 100 are connected to the single output line 120. In a case where the plurality of pixels 100 constitute a pixel array including a plurality of pixel columns, at least one output line 120 is arranged in each of the pixel columns. A current source 121 and a column amplifier 301 are connected to the output line 120. The amplification transistor 118 and the current source 121 form a source-follower circuit. A signal output from the pixel 100 to the output line 120 is supplied to the column amplifier 301.

The reset transistor 117, the amplification transistor 118, and the selection transistor 119 are disposed on the substrate not illustrated. The substrate is a silicon substrate, for example. The semiconductor layer 108 is disposed on the substrate including the pixel circuit disposed thereon including the amplification transistor 118. In other words, the semiconductor layer 108 is laminated on the substrate including the pixel circuit disposed thereon.

Figure 1B:
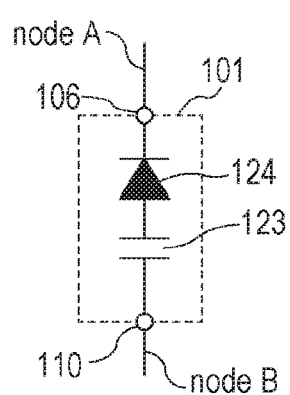
FIG. 1B is a diagram illustrating an equivalent circuit of a photoelectric conversion unit.
Figure 1C:
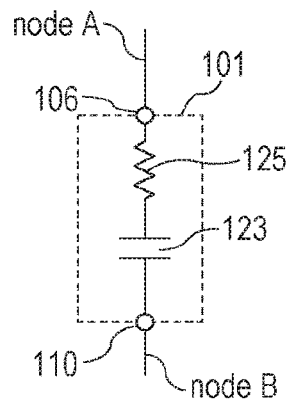
FIG. 1C is a diagram illustrating an equivalent circuit of the photoelectric conversion unit.

FIGS. 1B and 1C are diagrams illustrating equivalent circuits of the photoelectric conversion unit including the light receiving region 101. In this embodiment, the photoelectric conversion unit includes the semiconductor layer 108 and the insulating layer 109. Accordingly, the photoelectric conversion unit includes a capacitance component between the upper electrode S 106 and the electrode P 110. In the equivalent circuits of FIGS. 1B and 1C, the capacitance component is represented as a second capacitor 123 disposed between the upper electrode S 106 and the electrode P 110. Note that a case where the photoelectric conversion unit includes the blocking layer 107 is illustrated in FIG. 1B. Therefore, the blocking layer 107 and the semiconductor layer 108 are represented by a circuit symbol 124 of a diode. On the other hand, a case where the photoelectric conversion unit does not include a blocking layer is illustrated in FIG. 1C. Therefore, the semiconductor layer 108 is represented by a circuit symbol 125 of a resistance. A configuration of the semiconductor layer 108 will be described later.

In this embodiment, the light receiving region 101 and the charge discharging region 103 are defined on a continuous portion of the semiconductor layer 108. The continuous portion of the semiconductor layer 108 is formed of a substantially uniform material in the semiconductor layer 108, for example. A manufacturing error occurs in manufacturing of the imaging apparatus. Therefore, the continuous portion of the semiconductor layer 108 may have a difference between materials caused by the manufacturing error. In other words, the continuous portion of the semiconductor layer 108 is formed at once. After the continuous portion of the semiconductor layer 108 is formed at once, only a portion of the continuous portion may be processed. Therefore, the continuous portion of the semiconductor layer 108 may include a plurality of portions having different thickness or different widths.

Functions of the units included in the pixel 100 will be described. The light receiving region 101 of the semiconductor layer 108, the first portion (the first electrode) of the upper electrode S 106 disposed on the light receiving region 101, the electrode P 110, and the insulating layer 109 disposed between the semiconductor layer 108 and the electrode P 110 form the photoelectric conversion unit. The photoelectric conversion unit generates signal charge in accordance with incident light and accumulates charge generated due to the incident light. The accumulation of the signal charge in the photoelectric conversion unit and discharge or transfer of the signal charge supplied from the photoelectric conversion unit may be controlled in accordance with a voltage applied to a portion between the upper electrode S 106 and the electrode P 110.

The charge discharging region 103 on the semiconductor layer 108, the second portion (the third electrode) of the upper electrode S 106 disposed on the charge discharging region 103, the electrode D 112, and the insulating layer 109 disposed in a portion between the semiconductor layer 108 and the electrode D 112 may form a charge discharging unit. The charge of the photoelectric unit is discharged to a charge discharging unit. Since the charge discharging region 103 and the electrode D 112 are positioned adjacent to each other, the charge discharged to the charge discharging region 103 is discharged to a power source VD.

The charge transfer region 102 of the semiconductor layer 108, the upper electrode S 106, the transfer electrode T 111, and the insulating layer 109 disposed between the semiconductor layer 108 and the transfer electrode T 111 constitute a charge transfer unit. In this embodiment, the light receiving region 101 and the charge discharging region 103 are arranged on the continuous portion of the semiconductor layer 108 through the charge transfer region 102. With this configuration, the charge transfer unit may transfer the charge accumulated in the light receiving region 101 to the charge discharging region 103. The transfer of the charge is controlled by a bias voltage supplied to the transfer electrode T 111.

In this embodiment, the light receiving region 101, the charge transfer region 102, and the charge discharging region 103 are arranged in different portions in the continuous portion of the semiconductor layer 108. The light receiving region 101, the charge transfer region 102, and the charge discharging region 103 are independently controlled. In this way, the light receiving region 101, the charge transfer region 102, and the charge discharging region 103 realize different functions. The light receiving region 101 has a function of generating charge by the photoelectric conversion and a function of accumulating charge. The charge transfer region 102 has a function of transferring the charge from the light receiving region 101 to the charge discharging region 103. The charge discharging region 103 has a function of holding the charge independently from the light receiving region 101.

Next, the pixel circuit of the pixel 100 will be described. The electrode P 110 is electrically connected to a gate of the amplification transistor 118. As illustrated in FIG. 1A, the electrode P 110 and the gate of the amplification transistor 118 may be short circuited. A switch may be disposed in an electric path between the electrode P 110 and the amplification transistor 118.

In FIG. 1A, a node between the electrode P 110 and the gate of the amplification transistor 118 is referred to as a "node B". The node B may be electrically floated. Since the node B is electrically floated, a voltage of the node B may vary depending on the charge accumulated in the light receiving region 101. With this configuration, a signal based on the charge generated by the photoelectric conversion may be input to the amplification transistor 118. The amplification transistor 118 amplifies the input signal and outputs the amplified signal to the output line 120.

The pixel circuit of the pixel 100 includes the reset transistor 117 which resets the voltage of the electrode P 110. The reset transistor 117 supplies a reset voltage Vres to the electrode D 112 and the gate of the amplification transistor 118. Specifically, the reset transistor 117 resets a voltage of the input node (the node B) of the amplification transistor 118. The reset transistor 117 is controlled to be on or off. When the reset transistor 117 is turned on, the reset voltage Vres is supplied to the node B. When the reset transistor 117 is turned off, the node B is electrically floated.

The first capacitor Cm 116 is electrically connected to the electrode P 110. The electrode P 110 and the first capacitor Cm 116 may be short circuited. A switch may be disposed in an electric path between the electrode P 110 and the first capacitor Cm 116.

The first capacitor Cm 116 includes two electrodes which are opposed to each other with an insulating body interposed therebetween. The two electrodes are formed of a conductive material, such as polysilicon or metal. Alternatively, the first capacitor Cm 116 includes a semiconductor region and a gate electrode disposed on the semiconductor region through a gate insulating film. The semiconductor region included in the first capacitor Cm 116 preferably has an impurity concentration which is higher than those of a source region and a drain region of the transistor. The gate electrode is formed of a conductive material, such as polysilicon or metal.

The first capacitor Cm 116 includes a first terminal electrically connected to the electrode P 110 and a second terminal different from the first terminal. The terminals are formed of a conductive material, such as metal or polysilicon, or the semiconductor region. A certain voltage is supplied to the second terminal. In this embodiment, the second terminal is connected to the power source VP 113 and a plurality of voltages are supplied from the power source VP 113 to the second terminal. Alternatively, the second terminal may be grounded. In FIG. 1A, the node B includes the first terminal, and a node C includes the second terminal. The voltage Vm is supplied to the node B, and the voltage Vp is supplied to the node C. The voltages Vm and Vp have the relationship depending on a capacitance value of the first capacitor Cm 116.

Next, control of the pixel 100 will be described. First, in an exposure period, voltages of the upper electrode S 106 and the electrode P 110 are controlled so that a reverse bias is applied to the light receiving region 101. By this, signal charge generated in the light receiving region 101 is accumulated in the light receiving region 101 in the exposure period. Subsequently, voltages of the electrode P 110, the transfer electrode T 111, and the electrode D 112 are controlled so that the charge held in the light receiving region 101 is transferred to the charge discharging region 103. For example, the charge may be transferred by setting a potential of the charge discharging region 103 smaller than that of the light receiving region 101. By transferring the accumulated signal charge, the voltage is changed in the node B in accordance with an amount of the signal charge. Accordingly, a signal based on the signal charge may be read from the pixel 100. In other words, according to this embodiment, a signal based on the charge accumulated in the light receiving region 101 is read by discharging the charge from the light receiving region 101.

The voltage Vp of the second terminal of the first capacitor Cm 116 is controlled so that the voltage Vm of the electrode P 110 is controlled. The power source VP 113 supplies a first voltage and a second voltage which is different from the first voltage to the second terminal of the first capacitor Cm 116 as the voltage Vp. Note that, in a modification of this embodiment, a power source VM, not illustrated, supplies a first voltage and a second voltage which is different from the first voltage to the electrode P 110 as the voltage Vm.

According to this embodiment, in the semiconductor layer 108, charge is transferred in a first direction from the light receiving region 101 to the charge discharging region 103. The first direction is parallel to the surface of the substrate including the pixel circuit disposed thereon. The surface of the substrate is an interface between the semiconductor region constituting the substrate and an insulator disposed on the semiconductor region. In a case where the insulator isolation structure by the STI or the LOCOS is employed, the interface between the semiconductor region and the insulator region is not flat. In this case, the interface between the semiconductor region and the insulator region in a transistor channel disposed on the substrate, for example, serves as the surface of the substrate.

With this configuration, most or all of the signal charge accumulated in the light receiving region 101 is transferred to the charge discharging region 103 in a short time. Consequently, noise may be reduced.

The voltages applied to the units of the pixel 100 will now be described. In this embodiment, a case where a hole is used as the signal charge among charges generated by the photoelectric conversion will be described. Note that, in this embodiment, a voltage of a grounded node is 0 V which is a reference voltage unless otherwise stated.

The power source VS 104 supplies a certain voltage Vs (6 V in this embodiment) to the upper electrode S 106. The power source VP 113 supplies the voltage Vp (3 to 5 V in this embodiment). The voltages Vs and Vp have the relationship in which a reverse bias is applied to a hole of the light receiving region 101. Holes generated by the photoelectric conversion are accumulated in the vicinity of an interface between the light receiving region 101 and the insulating layer 109.

Figure 4A:
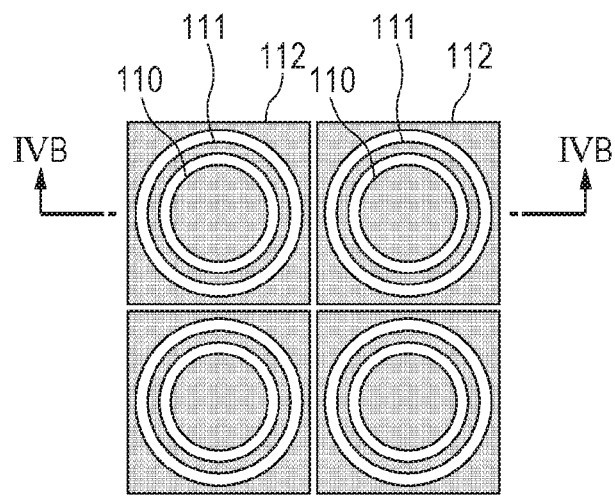
FIG. 4A is a diagram schematically illustrating a planar structure of the imaging apparatus.
Figure 4B:
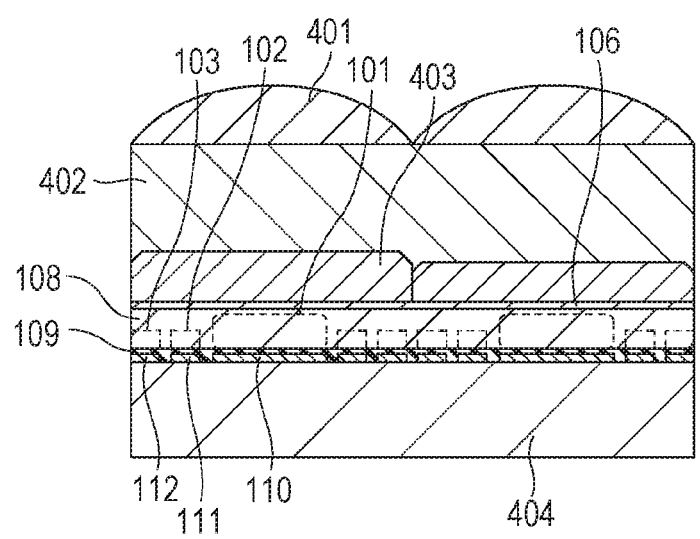
FIG. 4B is a diagram schematically illustrating a sectional structure of the imaging apparatus.

Since the signal charge is a hole in this embodiment, the voltage Vm of the electrode P 110 is lower than the voltage Vt of the transfer electrode T 111 when the signal charge is accumulated. As illustrated in FIGS. 4A and 4B, the transfer electrode T 111 is disposed so as to surround the electrode P 110 in a plane in parallel to the surface of the substrate. Therefore, by setting the voltage Vt larger than the voltage Vm, a well of a potential is formed in the light receiving region 101 disposed in the vicinity of the electrode P 110. The holes generated by the photoelectric conversion are efficiently collected in the potential well of the light receiving region 101. Since the voltage Vt of the transfer electrode T 111 forms a potential barrier, leakage of the charge accumulated in the light receiving region 101 may be reduced. In a case where the signal charge is an electron, the voltage Vm of the electrode P 110 is set higher than the voltage Vt of the transfer electrode T 111.

In this embodiment, the power source VP 113 supplies at least a first voltage Vp1 and a second voltage Vp2 which is different from the first voltage Vp1 to the second terminal of the first capacitor Cm 116. Since the signal charge is a hole in this embodiment, the second voltage Vp2 is higher than the first voltage Vp1. In this embodiment, the first voltage Vp1 is 3 V and the second voltage Vp2 is 5 V. In a case where the signal charge is an electron, the second voltage Vp2 is lower than the first voltage Vp1. In the case where the signal charge is an electron, the first voltage Vp1 is 5 V and the second voltage Vp2 is 3 V, for example.

In the case where the signal charge is a hole, the reset voltage Vres is lower than the voltage Vs to be supplied to the upper electrode S 106. In the case where the signal charge is an electron, the reset voltage Vres is higher than the voltage Vs to be supplied to the upper electrode S 106. In this embodiment, since a hole signal is used, the voltage Vs to be supplied to the upper electrode S 106 is 6 V and the reset voltage Vres is 3 V.

In this embodiment, the power source VP 113 controls the voltage Vm of the node B which is in capacitive coupling with the node C through the first capacitor Cm 116 by supplying the voltage Vp including the plurality of voltages to the node C. Therefore, the magnitude relationship between the voltage Vp supplied to the node C and the reset voltage Vres or the voltage Vs supplied to the upper electrode S 106 in terms of direct current is not particularly limited.

In this embodiment, the voltage Vm supplied to the electrode P 110, the voltage Vt supplied to the transfer electrode T 111, and the voltage Vd supplied to the electrode D 112 are controlled so that the signal charge accumulated in the light receiving region 101 is rapidly and completely transferred to the charge discharging region 103. In the case where the signal charge is a hole, the charge may be transferred based on the following relationship: Vm>Vt>Vd. In the case where the signal charge is an electron, the charge may be transferred based on the following relationship: Vm<Vt<Vd.

Figure 2:
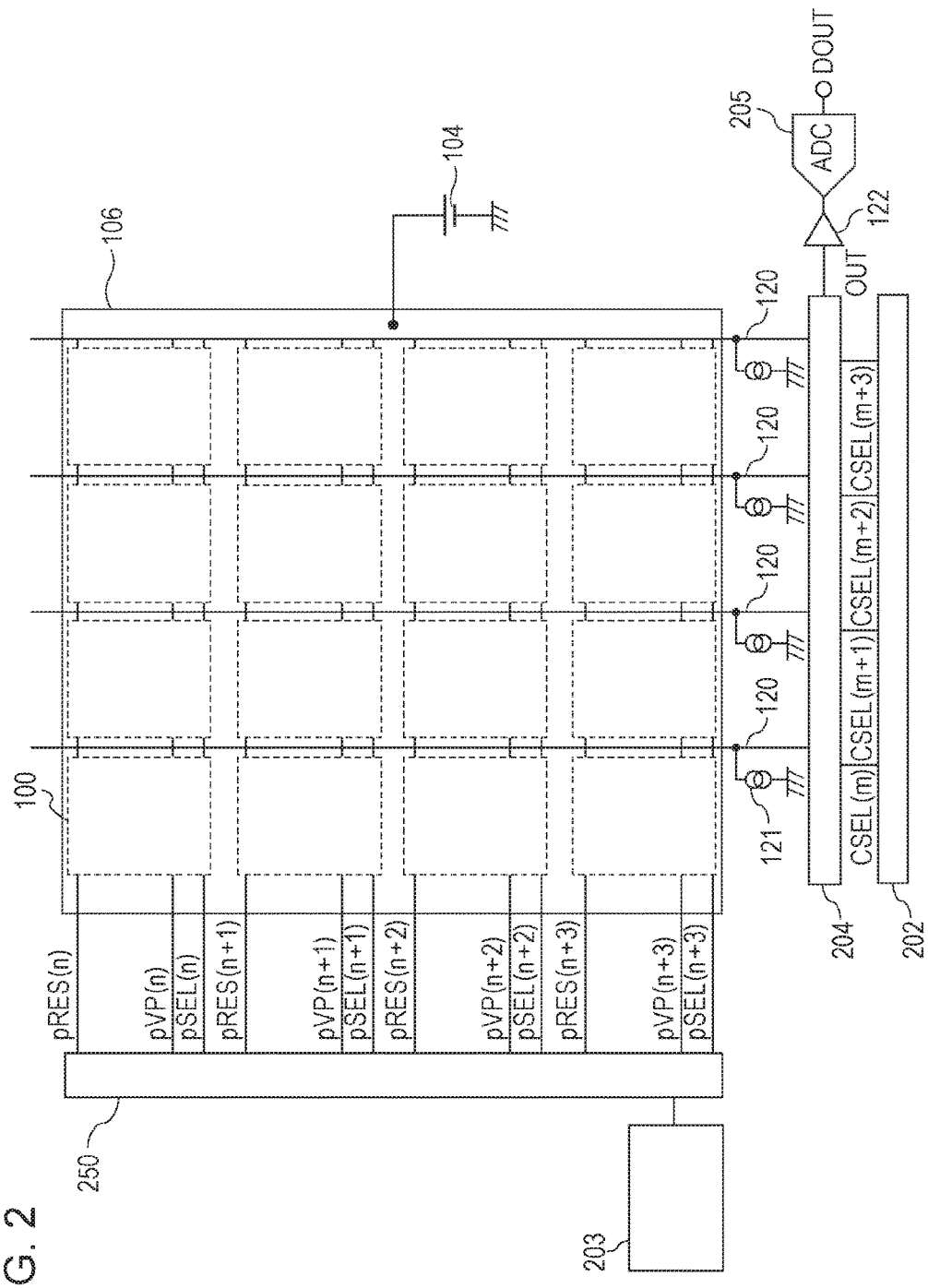
FIG. 2 is a diagram schematically illustrating an entire configuration of the imaging apparatus.

FIG. 2 is a diagram schematically illustrating an entire circuit configuration of the imaging apparatus according to this embodiment. In FIG. 2, 16 pixels 100 arranged in a matrix of 4 rows by 4 columns are illustrated. A plurality of pixels 100 included in one column are connected to one output line 120. A row driving circuit 250 supplies a driving signal pRES, a driving signal pVP (the voltage Vp of the node C), and a driving signal pSEL to the pixels 100. The driving signal pRES is supplied to a gate of the reset transistor 117 in FIG. 1A. The driving signal pSEL is supplied to a gate of the selection transistor 119. By these driving signals, the reset transistor 117 and the selection transistor 119 are controlled. The plurality of pixels 100 included in one row are connected to a common driving signal line. The driving signal line transmits the driving signal pRES, the driving signal pSEL, and the like. In FIG. 2, reference symbols, such as (n) and (n+1), indicating rows are assigned to distinguish driving signals supplied to different rows. The same is true on the other drawings. In this embodiment, the fixed voltage Vd is supplied to the electrode D 112. Therefore, a signal line which supplies a driving signal pVD is omitted in FIG. 2.

According to this embodiment, the voltages Vp supplied to the second terminals (the nodes C) of the first capacitors Cm 116 are independently controlled for individual rows. Therefore, the row driving circuit 250 selects one of the rows to which the voltage Vp is supplied from a voltage supplying unit 203. Note that reference symbols, such as (n) and (n+1), indicating rows are assigned to distinguish voltages Vd supplied to different rows. In a case where a global electronic shutter operation is to be performed, the driving signals are collectively driven in all the rows. In a case where a rolling shutter operation is to be performed, the driving signals are controlled for individual rows. According to the configuration described above, the plurality of pixels 100 may be driven for each row in this embodiment.

The individual output lines 120 are connected to corresponding column circuits 204. The column amplifier 301 illustrated in FIG. 1A is included in a corresponding one of the column circuits 204. Column driving circuits 202 drive the column circuits 204 for individual columns. Specifically, the column driving circuits 202 supply driving signals CSEL to the column circuits 204. Note that reference symbols, such as (m) and (m+1), indicating columns are assigned to distinguish driving signals supplied to different columns. The same is true on the other drawings. With this configuration, signals read in parallel for individual rows may be successively output to an output unit.

Figure 3:
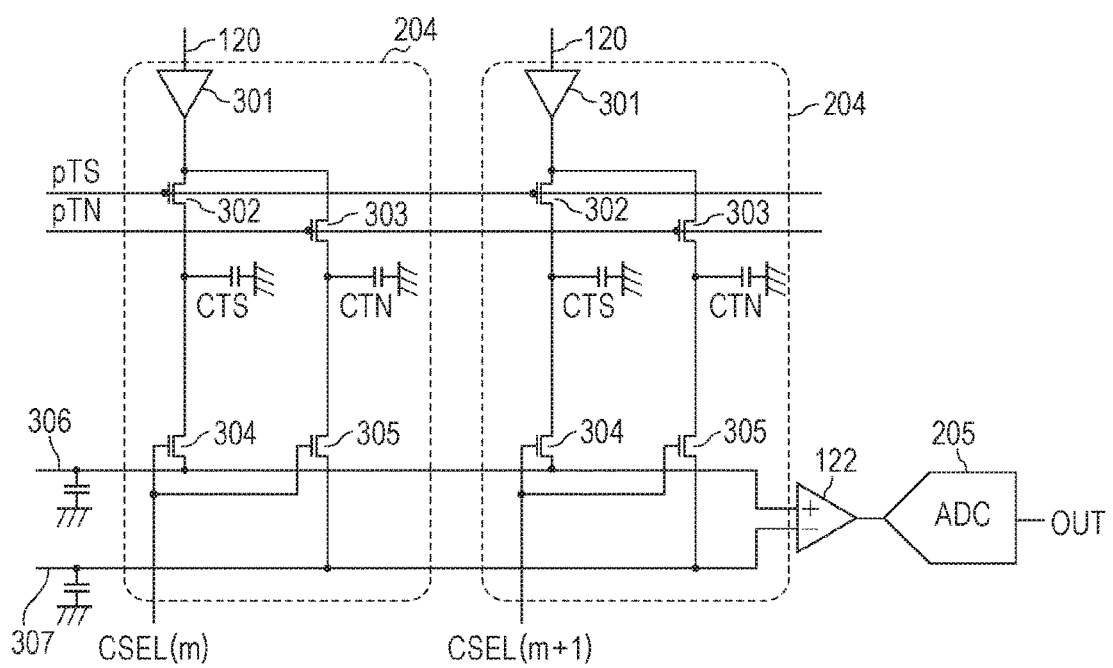
FIG. 3 is a diagram illustrating equivalent circuits of column circuits of the imaging apparatus.

The column circuits 204 will be described in detail. FIG. 3 is a diagram illustrating equivalent circuits of the column circuits 204 in m-th column and (m+1)-th column. The column circuits 204 of the other columns are omitted.

A signal of the output line 120 is amplified by the column amplifier 301. An output node of the column amplifier 301 is connected to a capacitor CTS through an S/H switch 302. The output node of the column amplifier 301 is also connected to a capacitor CTN through an S/H switch 303. The S/H switches 302 and 303 are controlled by driving signals pTS and pTN, respectively. With this configuration, a noise signal N including reset noise from the pixel 100 and an optical signal S may be held. Accordingly, the imaging apparatus of this embodiment is capable of performing the correlated double sampling. Specifically, a signal from which the reset noise is removed may be read.

The capacitor CTS is connected to a horizontal output line 306 through a horizontal transfer switch 304. The capacitor CTN is connected to a horizontal output line 307 through a horizontal transfer switch 305. The horizontal transfer switches 304 and 305 are controlled by the driving signals CSEL supplied from a corresponding one of the column driving circuits 202.

The horizontal output lines 306 and 307 are connected to an output amplifier 122. The output amplifier 122 amplifies a differential signal between a signal of the horizontal output line 306 and a signal of the horizontal output line 307 and outputs the amplified differential signal. The amplified signal is supplied to an analog/digital conversion unit 205 which converts the analog differential signal into a digital signal and outputs the digital signal to an outside of the imaging apparatus.

Note that the column circuits 204 may be analog/digital conversion circuits. In this case, each of the analog/digital conversion circuits includes a holding unit, such as a memory or a counter, which holds a digital signal. The holding unit holds digital signals converted from the noise signal N and the optical signal S.

Next, a planar structure and a sectional structure of the imaging apparatus of this embodiment will be described. FIG. 4A is a diagram schematically illustrating a planar structure of the imaging apparatus. Portions the same as those of FIGS. 1A to 1C are denoted by reference numerals the same as those of FIGS. 1 to 1C. In FIG. 4A, pixels 100 in a matrix of 2 rows by 2 columns are illustrated. In FIG. 4A, arrangement of the electrode P 110, the transfer electrode T 111, and the electrode D 112 in a plane in parallel to the surface of the substrate including the pixel circuit disposed thereon is schematically illustrated.

FIG. 4B is a diagram schematically illustrating a sectional structure of the imaging apparatus. A cross section of FIG. 4B is obtained taken along a dotted line IVB to IVB of FIG. 4A. Portions the same as those of FIGS. 1A to 1C are denoted by reference numerals the same as those of FIGS. 1A to 1C. In FIG. 4B, micro lenses 401, a planarization layer 402, color filters 403, and the interlayer film 404 interposed between the substrate and the semiconductor layer 108 are illustrated. The light receiving region 101, the charge transfer region 102, and the charge discharging region 103 are defined on the semiconductor layer 108. Note that a conductive member, not illustrated, which connects an electrode to a pixel circuit is disposed on the interlayer film 404.

As illustrated in FIG. 4B, the electrode P 110, the transfer electrode T 111, and the electrode D 112 are arranged such that centers of the gravities thereof coincide with one another. With this configuration, the micro lens 401 may efficiently focus incident light by the photoelectric conversion unit (the light receiving region 101 and the electrode P 110). An electric field distribution and a light incident distribution of the photoelectric conversion unit coincide with each other, and therefore, charge generated due to the photoelectric conversion is efficiently collected by the light receiving region 101.

In the planar surface of FIG. 4A, the transfer electrode T 111 surrounds the electrode P 110. With this arrangement, the charge accumulated in the light receiving region 101 may be rapidly transferred to the charge discharging region 103. Consequently, the imaging apparatus may be driven at higher speed. A potential barrier may be formed by a bias voltage applied to the transfer electrode T 111. By this, generated charge may be efficiently collected in the light receiving region 101 and the collected charge is prevented from being leaked to the charge discharging region 103 and adjacent pixels. The charge transfer may be speedily and completely performed.

Next, a planar structure and a sectional structure of the pixel circuit disposed on the substrate will be described. FIG. 5A is a diagram schematically illustrating arrangement of the pixel circuits disposed on the substrate in a plan view. Specifically, the arrangement of the pixel circuits obtained when the pixel circuits are projected on a plane in parallel to the surface of the substrate is illustrated in FIG. 5A. FIG. 5B is a diagram schematically illustrating a sectional structure of a substrate 550, the interlayer film 404 disposed on the substrate 550, and the semiconductor layer 108. The cross section illustrated in FIG. 5B is obtained taken along a line VB to VB in FIG. 5A. Portions having functions the same as those of FIGS. 1A to 1C are denoted by reference numerals the same as those of FIGS. 1A to 1C. Note that, as for the transistors, reference numerals are assigned to gate electrodes of the transistors. A reference numeral which is the same as that of a driving signal supplied to the driving signal line is assigned to the conductive member which constitutes the driving signal line. For example, a conductive member having a reference symbol "pRES" constitutes a driving signal line which supplies the driving signal pRES.

FIG. 5A is a diagram illustrating four pixels 100 arranged in a matrix of 2 rows by 2 columns. Only in a pixel in an upper right portion, portions corresponding to the electrode P 110, the transfer electrode T 111, and the electrode D 112 of FIG. 4A are illustrated by dotted lines. In the other pixels, illustration of the electrode P 110, the transfer electrode T 111, and the electrode D 112 is omitted. In FIG. 5A, an electrode 502 constituting the first terminal of the first capacitor Cm 116 and an electrode 503 constituting the second terminal of the first capacitor Cm 116 are illustrated. The electrodes 502 and 503 overlap with each other in a plan view.

As illustrated in FIGS. 5A and 5B, the electrode 502 constituting the first terminal of the first capacitor Cm 116 is electrically connected to the amplification transistor 118 through a contact 501. The electrode 502 constituting the first terminal of the first capacitor Cm 116 is electrically connected to the electrode P 110 through a contact 506. The electrode 503 constituting the second terminal of the first capacitor Cm 116 is connected to a driving signal line pVP through a contact 507. Furthermore, a contact 504 is used to connect the transfer electrode T 111 and a driving signal line pVT to each other. A contact 505 is used to connect the electrode D 112 and a driving signal line pVD to each other.

As illustrated in FIGS. 5A and 5B, the electrode 503 of the first capacitor Cm 116 is connected to the driving signal line pVP. The driving signal line pVP transmits the voltage Vp supplied from the power source VP 113. In this embodiment, the driving signal lines pVP are disposed in respective rows. Specifically, a driving signal line pVP in a certain one of the rows is electrically insulated from the driving signal lines pVP in the other rows. With this configuration, the voltage Vp of the second terminal (the node C) of the first capacitor Cm 116 may be independently controlled for each row.

As illustrated in FIG. 5B, the imaging apparatus includes the substrate 550. The substrate 550 includes a source region and a drain region of pixel transistors. The pixel transistors are included in the pixel circuit, and corresponds to the reset transistor 117, the amplification transistor 118, and the selection transistor 119, for example. The interlayer film 404 including gate electrodes of the pixel transistors and a conductive member forming wiring is disposed on the substrate 550. The insulating layer 109 and the semiconductor layer 108 are disposed on the interlayer film 404 in this order.

The upper electrode S 106 is constituted by a conductive member which allows a certain amount of light to pass. Examples of a material of the upper electrode S 106 include indium, such as indium tin oxide (ITO), compound including tin, and/or compound, such as ZnO. With this configuration, a large amount of light may be incident on the light receiving region 101. Therefore, sensitivity may be improved. As another example, polysilicon or metal which is thin enough to allow a certain amount of light to be transmitted may be used as the upper electrode S 106. Since metal has low resistance, if metal is used as the material of the upper electrode S 106, lower power consumption and high-speed driving are advantageously realized. Note that a transmittance of the light of the upper electrode S 106 is not particularly limited as long as the transmittance is not zero.

The semiconductor layer 108 is formed of intrinsic amorphous silicon (hereinafter referred to as "a-Si"), low-concentration P-type a-Si, low-concentration N-type a-Si, or the like. Alternatively, the semiconductor layer 108 may be formed of a compound semiconductor. Examples of the compound semiconductor include a III-V compound semiconductor, such as BN, GaAs, GaP, AlSb, or GaAlAsP, a II-VI compound semiconductor, such as CdSe, ZnS, or HdTe, and a IV-VI compound semiconductor, such as PbS, PbTe, or CuO. Alternatively, the semiconductor layer 108 may be formed of an organic material. Examples of the organic material include Buckminster-fullerene, coumalin 6 (C6), rhodamine 6G (R6G), zinc phthalocyanine (ZnPc), quinacridone, a phthalocyanine compound, and a naphthalocyanine compound. Furthermore, the semiconductor layer 108 may be formed of a quantum dot film formed of the compound semiconductor described above. An impurity concentration of the semiconductor layer 108 is preferably low or an intrinsic semiconductor layer 108 is preferably used. With this configuration, since a sufficiently large depletion layer may be ensured in the semiconductor layer 108, effects of high sensitivity and noise reduction may be attained.

The blocking layer 107 blocks flow of charge of a conductive type the same as that of the signal charge into the semiconductor layer 108 from the upper electrode S 106. In a case where the upper electrode S 106 is formed of ITO, the upper electrode S 106 may function as the blocking layer 107 depending on a combination with a semiconductor forming the semiconductor layer 108. Specifically, a potential barrier is formed such that flow of charge having a conductive type the same as that of the signal charge from the upper electrode S 106 to the semiconductor layer 108 is blocked.

An N-type or P-type semiconductor which is the same type as the semiconductor used in the semiconductor layer 108 and which has a impurity concentration higher than that of a semiconductor used in the semiconductor layer 108 may be used for the blocking layer 107. In a case where a-Si is used for the semiconductor layer 108, for example, an N-type a-Si having a high impurity concentration or a P-type a-Si having a high impurity concentration is used for the blocking layer 107. A position of a Fermi level varies depending on an impurity concentration, and therefore, a potential barrier may be formed only for one of an electron and a hole. The blocking layer 107 has a conductive type in which charge of a conductive type opposite to that of the signal charge is a majority carrier.

Alternatively, the blocking layer 107 may be formed of a material different from that of the semiconductor layer 108. With this configuration, heterojunction is formed. Since different materials cause different band gaps, a potential barrier may be formed only for one of an electron and a hole.

The insulating layer 109 is disposed between the semiconductor layer 108 and the electrode P 110, between the semiconductor layer 108 and the transfer electrode T 111, and between the semiconductor layer 108 and the electrode D 112. The insulating layer 109 is formed of an insulating material. Examples of the material of the insulating layer 109 include an inorganic material, such as silicon oxide, amorphous silicon oxide (a-SiO hereinafter), silicon nitride, or amorphous silicon nitride (a-SiN) or an organic material. The insulating layer 109 has such a thickness that charge is not transmitted due to a tunnel effect. With this configuration, leakage current may be reduced, and therefore, noise may be reduced. Specifically, a thickness of the insulating layer 109 is equal to or larger than 50 nm.

If a-Si, a-SiO, or a-SiN is used for the blocking layer 107, the semiconductor layer 108, and the insulating layer 109, a hydrotreatment process may be performed and dangling bond may be formed in a terminal. With this configuration, the noise may be reduced.

The electrode P 110, the transfer electrode T 111, and the electrode D 112 are individually constituted by a conductive member, such as metal. Material which is the same as a conductive member which constitutes wiring or a conductive member which constitutes a pad electrode for external connection is used for the electrode P 110, the transfer electrode T 111, and the electrode D 112. With this configuration, some or all of the electrode P 110, the transfer electrode T 111, the electrode D 112, the wiring, and the pad electrode may be simultaneously formed. Accordingly, a manufacturing process may be simplified.

An operation of this embodiment will be described with reference to FIGS. 6A to 6F. FIGS. 6A to 6C are diagrams schematically illustrating a movement of signal charge (a hole) in the semiconductor layer 108. FIGS. 6D to 6F are diagrams schematically illustrating a potential in an interface between the semiconductor layer 108 and the insulating layer 109. In FIGS. 6D to 6F, axes of ordinates denote a potential relative to a hole. A potential of a hole becomes lower in an upper portion in the axes of ordinates. Therefore, a voltage becomes lower in an upper portion in the axes of ordinates.

FIG. 6A is a diagram illustrating a state in which holes generated by the photoelectric conversion are accumulated in the light receiving region 101. FIG. 6D is a diagram schematically illustrating potentials of the holes in the light receiving region 101, the charge transfer region 102, and the charge discharging region 103 corresponding to FIG. 6A. White circles indicate the holes. In this case, the voltage Vm of the electrode P 110, the voltage Vt of the transfer electrode T 111, and the voltage Vd of the electrode D 112 have one of the following relationships: Vd=Vm<Vt, Vd<Vm<Vt, and Vm<Vd<Vt. According to this relationship, a potential barrier is formed between the light receiving region 101 and the charge discharging region 103 so as to electrically separate the light receiving region 101 and the charge discharging region 103 from each other. Specifically, the transfer electrode T 111 functions as a separate electrode which separates the light receiving region 101 and the charge discharging region 103 from each other. The voltage Vs and the voltage Vt are preferably set equal to each other so that the electrical separate function is improved. Note that the voltage Vm of the electrode P 110 is controlled in accordance with the voltage Vp supplied from the power source VP 113 and a capacitance value of the first capacitor Cm 116.

FIG. 6B is a diagram illustrating a state in which the holes accumulated in the light receiving region 101 are transferred to the charge discharging region 103. FIG. 6E is a diagram schematically illustrating potentials of the holes in the light receiving region 101, the charge transfer region 102, and the charge discharging region 103 corresponding to FIG. 6B. In this case, the voltage Vm of the electrode P 110, the voltage Vt of the transfer electrode T 111, and the voltage Vd of the electrode D 112 have one of the following relationships: Vd=Vt<Vm, and Vd<Vt<Vm. According to this relationship, a potential slope is formed from the light receiving region 101 to the charge discharging region 103. Therefore, the holes accumulated in the light receiving region 101 are transferred to the charge discharging region 103 along the interface between the semiconductor layer 108 and the insulating layer 109. The charge discharging region 103 is electrically connected to the electrode D 112. Therefore, the signal charge (the holes) transferred to the charge discharging region 103 is recoupled with electrons and disappear. In other words, the signal charge in the light receiving region 101 is discharged.

FIG. 6C is a diagram illustrating a state in which the signal charge has been transferred to the charge discharging region 103. FIG. 6F is a diagram schematically illustrating potentials of the holes in the light receiving region 101, the charge transfer region 102, and the charge discharging region 103 corresponding to FIG. 6C. States of the voltage Vm of the electrode P 110, the voltage Vt of the transfer electrode T 111, and the voltage Vd of the electrode D 112 are the same as states before the signal charge is transferred, that is, the states illustrated in FIG. 6D. Specifically, one of the following relationships is satisfied: Vd=Vm<Vt, Vd<Vm<Vt, and Vm<Vd<Vt. However, the signal charge is lost in the light receiving region 101 due to the transfer operation. Therefore, a voltage change in accordance with an amount of charge transferred to the charge discharging region 103 occurs in the gate of the amplification transistor 118 connected to the electrode D 112 through the capacitive coupling of the insulating layer 109. That is, a signal corresponding to the amount of signal charge accumulated in the light receiving region 101 in the exposure period is supplied to the gate of the amplification transistor 118.

In this embodiment, the semiconductor layer 108 is continuously formed from the light receiving region 101 through the charge transfer region 102 to the charge discharging region 103 in a direction in parallel to the surface of the substrate. Accordingly, as illustrated in FIG. 6B, the signal charge generated in the semiconductor layer 108 is transferred in the direction in parallel to the surface of the substrate including the pixel circuit disposed thereon.

With this configuration, the charge may be transferred in the direction along the interface between the semiconductor layer 108 and the insulating layer 109. These interfaces have a small defect level, and therefore, high speed transfer of charge is performed.

In a case where the charge is transferred to the upper electrode S 106, a charge transfer path is formed inside the semiconductor layer 108. In this case, a speed of the transfer is controlled in accordance with a movement degree of the material of the semiconductor layer 108. Accordingly, it is difficult to transfer the charge at high speed. In particular, in a case where the semiconductor layer 108 is formed thick to obtain sufficient sensitivity for light of a long wavelength, a distance of a transfer path for transferring the charge to the upper electrode S 106 is large. On the other hand, in a case where the charge is transferred in the direction in parallel to the surface of the substrate, the transfer path may be reduced. This is because a distance between the light receiving region 101 which is a transfer source in the semiconductor layer 108 and the charge discharging region 103 which is a transfer destination in the semiconductor layer 108 is not restricted by the sensitivity for the light of a long wavelength or the like.

In this way, according to the imaging apparatus of this embodiment, the charge may be efficiently transferred. Accordingly, noise, such as an image lag, due to residual charge may be reduced.

Note that, in this embodiment, the voltage Vm of the electrode P 110 is controlled by changing the voltage Vp supplied from the power source VP 113. However, in a case where the reset voltage Vres of the node B is smaller than the voltage Vd of the electrode D 112, the voltage Vp supplied from the power source VP 113 may be fixed. This is because the charge may be transferred only by controlling the voltage Vt of the transfer electrode T 111. Furthermore, the first capacitor Cm 116 may be omitted. Even if the first capacitor Cm 116 is omitted, the node B may have a parasitic capacitance.

Furthermore, the charge accumulated in the light receiving regions 101 is simultaneously transferred in a plurality of pixels and the charge is held by the charge discharging regions 103 until signals are read, and in this way, the global electric shutter operation may be realized.

Figure 7:
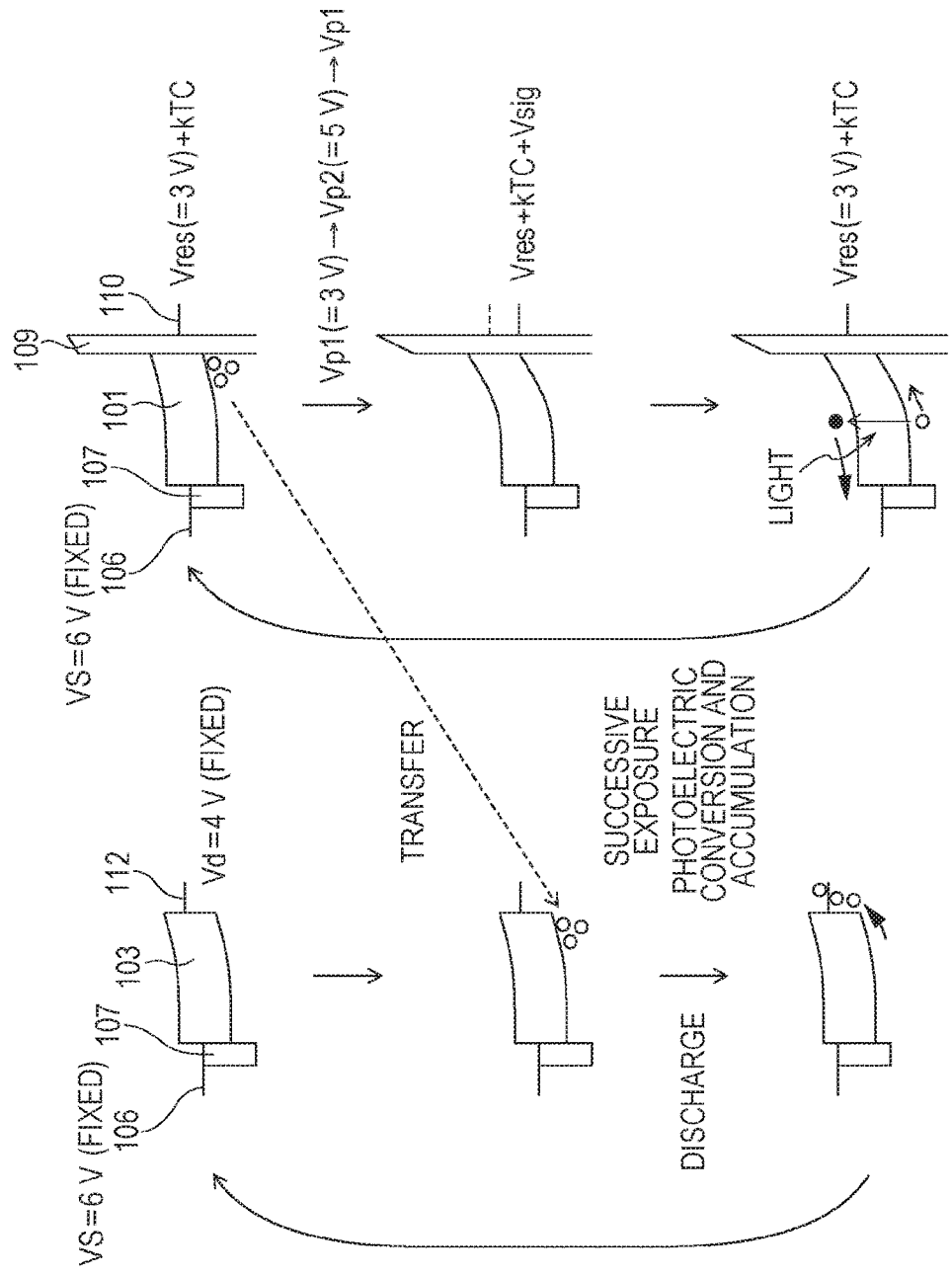
FIG. 7 is a diagram schematically illustrating an energy band of the photoelectric conversion unit of the imaging apparatus.

Next, an operation of reading a signal by discharging (transferring) signal charge to the charge discharging region 103 will be described with reference to FIG. 7. FIG. 7 is a diagram schematically illustrating an energy band of the semiconductor layer 108 in a direction vertical to the surface of the substrate. In FIG. 7, axes of ordinates denote potentials of holes. A potential of a hole is lower in an upper portion in the axes of ordinates. Therefore, a voltage becomes lower in an upper portion in the axes of ordinates. As for the upper electrode S 106, the electrode P 110, and the electrode D 112, energy levels of free electrons are illustrated. As for the blocking layer 107 and the semiconductor layer 108, band gaps between energy levels of conduction bands and energy levels of valance bands are illustrated.

Note that a potential of the semiconductor layer 108 in the interface between the semiconductor layer 108 and the insulating layer 109 is conveniently referred to as a "surface potential of the semiconductor layer 108" or simply referred to as a "surface potential".

Energy bands in the light receiving region 101 are illustrated on a right side in FIG. 7. Energy bands in the charge discharging region 103 are illustrated on a left side in FIG. 7. As for the light receiving region 101, energy bands of the upper electrode S 106, the blocking layer 107, the semiconductor layer 108, the insulating layer 109, and the electrode P 110 are illustrated. As for the charge discharging region 103, energy bands of the upper electrode S 106, the blocking layer 107, the semiconductor layer 108, and the electrode P 112 are illustrated.

An operation in the light receiving region 101 includes charge transfer (a step p1) and accumulation of signal charge generated by photoelectric conversion of incident light (a step p2). The steps will now be described.

In the step p1, as described with reference to FIGS. 6A to 6F, the signal charge accumulated in the light receiving region 101 is transferred to the charge discharging region 103 through the charge transfer region 102. The light receiving region 101 enters a state in which the holes disappear from a state in which the holes are accumulated. On the other hand, the charge discharging region 103 enters a state in which the holds are held from a state in which holes do not exist.

In a state before the signal charge is transferred, that is, in an exposure period for accumulating the signal charge, the reset voltage Vres is supplied to the electrode P 110. In this embodiment, the reset voltage Vres is 3 V. Note that a voltage of the electrode P 110 at this time may include a noise kTC generated at a time of resetting. The voltage Vs supplied to the upper electrode S 106 is fixed to 6 V, and the voltage Vd supplied to the electrode D 112 is fixed to 4 V.

In this embodiment, the power source VP 113 supplies the first voltage Vp1 (=3 V) and the second voltage Vp2 (=5 V). When the signal charge (holes) generated in the exposure period is accumulated in the light receiving region 101, the power source VP 113 supplies the first voltage Vp1 (=3 V) which is lower than the voltage Vs (=6 V) of the upper electrode S 106. In the step p1, the power source VP 113 supplies the second voltage Vp2 (=5 V) so that charge transfer is performed.

When the voltage Vp supplied from the power source VP 113 is changed, the voltage of the electrode P 110 (the node B of FIGS. 1A to 1C) is changed in a direction the same as the change of the voltage Vp. A voltage change amount dVm of the electrode P 110 is determined in accordance with a rate of a capacitance value C1 of the first capacitor Cm 116 connected to the electrode P 110 to a capacitance value C2 of the second capacitor 123 included in the light receiving region 101. Although a voltage change amount dVp of the node C is represented by "dVp=Vp2−Vp1", the voltage change amount dVm of the electrode P 110 is represented by "dVm=dVp×C1/(C1+C2)". Note that the node B including the electrode P 110 may include another capacitance component. However, the other capacitance component is sufficiently smaller than the capacitance value C1 of the first capacitor Cm 116. Therefore, a capacitance value of the node B is seen to be the same as the capacitance value C1 of the first capacitor Cm 116.

In this embodiment, the voltage of the electrode P 110 is changed by the voltage change amount dVm, and therefore, a surface potential of the light receiving region 101 becomes higher than the voltage Vd of the electrode D 112. As a result, the charge of the light receiving region 101 is transferred to the charge discharging region 103.

Subsequently, the first voltage Vp1 is supplied to the node C. By this, an inclination of a potential of the semiconductor layer 108 is reversed again. Therefore, electrons which have been intruded into the semiconductor layer 108 are discharged from the semiconductor layer 108. Meanwhile, the blocking layer 107 blocks intrusion of the holes into the semiconductor layer 108 from the upper electrode S 106. Therefore, a surface potential of the semiconductor layer 108 changes in accordance with the number of held holes.

When the transfer of the signal charge is to be performed, the node (the node B of FIG. 1A) including the electrode P 110 is electrically floated. Accordingly, the voltage of the electrode P 110 changes from the reset state by a voltage Vsig corresponding to the number of disappearing holes in accordance with the change of the surface potential. Specifically, the voltage Vsig corresponding to the number of holes held as the signal charge appears in the node B. The voltage Vsig corresponding to the number of held holes is referred to as an "optical signal component". The optical signal component Vsig is a signal based on the signal charge generated by the photoelectric conversion.

As described above, the signal charge (the holes) transferred to the charge discharging region 103 are recoupled with electrons supplied from the electrode D 112 and disappear.

After the signal including the optical signal component Vsig is read, the voltage of the electrode P 110 is reset and the photoelectric conversion is started. In the light receiving region 101, in pairs of electrons and holes generated by the incident light, the holes are accumulated as the signal charge. The electrons are discharged to the upper electrode S 106. Consequently, the number of holes corresponding to an amount of incident light is accumulated in the interface between the light receiving region 101 and the insulating layer 109.

Thereafter, the transfer of the signal charge and the accumulation of the signal charge are repeatedly performed. In a case of a moving image, one unit of this repeat corresponds to an operation for one frame. By repeatedly performing this operation on all the pixels at the same timings, the global electronic shutter operation may be performed.

As an operation of the pixel circuit, steps m1 to m3 below are repeatedly performed. In the step m1, an input node of the amplification transistor 118 is reset. In the step m2, the noise signal N is read (N read). In the step m3, an optical signal P is read (S read). The individual steps will now be described.

In the step m1, the reset transistor 117 is turned on. A voltage of the node including the electrode P 110, that is, a voltage of the node B illustrated in FIG. 1A is reset to the reset voltage Vres. Note that the reset transistor 117 may be in an on state during the exposure period. Alternatively, the reset transistor 117 may be turned on immediately before the reading of the noise signal N.

Thereafter, in the step m2, the reset transistor 117 is turned off. By this, the node B is electrically floated. Here, a reset noise (a noise kTC) may be generated by the reset transistor 117. The selection transistor 119 is turned on and the amplification transistor 118 outputs a noise signal N (Vres+kTC) including the reset noise from the pixel 100 (N read). The noise signal N is held by the capacitor CTN of the column circuit 204.

Thereafter, as described above, the signal charge is transferred from the light receiving region 101 to the charge discharging region 103. After the signal charge is transferred, the selection transistor 119 is turned on in the step m3. By this, the amplification transistor 118 outputs an optical signal S (Vsig+Vres+kTC) from the pixel 100. The optical signal S is held by the capacitor CTS of the column circuit 204. A difference between the noise signal N (Vres+kTC) read in the step m2 and the optical signal S (Vsig+Vres+kTC) read in the step m3 is a signal (an optical signal component) based on the voltage Vsig corresponding to the held signal charge.

In a case where the signal charge is an electron, the second voltage Vp2 is lower than the first voltage Vp1. Furthermore, the reset voltage Vres is set lower than the voltage Vs of the upper electrode S 106.

In this embodiment, the holes are discharged from the light receiving region 101 by controlling the potential of the semiconductor layer 108. The voltage change amount dVm of the electrode P 110 (the node B) is preferably large so that a potential slope from the light receiving region 101 to the charge discharging region 103 is easily formed. Since an amount of residual charge in the light receiving region 101 may be reduced, the noise may be reduced. Hereinafter, a unit which is efficient for attaining the large voltage change amount dVm of the electrode P 110 (the node B) will be described.

As described above, the relationship between the voltage change amount dVp of the node C and the voltage change amount dVm of the node B is represented as follows: dVm=dVp×C1/(C1+C2). Specifically, the larger the capacitance value C1 of the node B becomes, the larger the voltage change amount dVm of the node B becomes.

In this embodiment, the first capacitor Cm 116 is connected to the electrode P 110. Therefore, the capacitance value C1 of the node B may be increased. With this configuration, the voltage change amount dVm of the node B may be increased. As a result, noise may be reduced.

Next, the relationship among the capacitance value C1 of the first capacitor Cm 116, the capacitance value C2 of the second capacitor 123 included in the light receiving region 101, and the voltages supplied to the various units will be described.

In this embodiment, the light receiving region 101 includes the blocking layer 107, the semiconductor layer 108, and the insulating layer 109. The blocking layer 107 has a conductivity higher than those of the semiconductor layer 108 and the insulating layer 109. Therefore, the capacitance value C2 of the second capacitor 123 included in the light receiving region 101 is a composite capacitance of a capacitance component Ci of the semiconductor layer 108 and a capacitance component Cins of the insulating layer 109. Specifically, the capacitance value C2 of the second capacitor 123 is represented by Expression (1) below.

$$C2=Ci \times Cins/(Ci+Cins) \tag{1}$$

Assuming that an area of the electrode P 110 in a plan view is denoted by "Ss", a thickness of the semiconductor layer 108 is denoted by "di", a thickness of the insulating layer 109 is denoted by "dins", a relative permittivity of the semiconductor layer 108 is denoted by "Ei", a relative permittivity of the insulating layer 109 is denoted by "Fins", and a vacuum permittivity is denoted by "E0", the capacitance components Ci and Cins are represented by Expressions (2) and (3) below, respectively.

$$Ci=E0 \times Ei \times Ss/di \tag{2}$$

$$Cins=E0 \times Eins \times Ss/dins \tag{3}$$

A fringe electric field of the electrode P 110 is negligible, and therefore, only the area Ss of the electrode P 110 in the plan view is taken into consideration as an area to be used for capacitance calculation. The area Ss of the electrode P 110 in the plan view corresponds to an area of the electrode P 110 in FIG. 4A. Furthermore, the thickness di of the semiconductor layer 108 and the thickness dins of the insulating layer 109 are illustrated in FIG. 5B.

Assuming that an area of the electrode 502 or the electrode 503 in the plan view is denoted by "Sd", a distance between the electrode 502 and the electrode 503 is denoted by "dd", and a permittivity of the insulating layer between the electrode 502 and the electrode 503 is denoted by "Ed", the capacitance value C1 of the first capacitor Cm 116 is represented by Expression (4) below.

$$C1 = E0 \times Ed \times Sd/dd \quad (4)$$

In this embodiment, the voltage Vp of the node C is controlled to be the first voltage Vp1 or the second voltage Vp2 so that the voltage of the node B is controlled. When the capacitance value C1 of the first capacitor Cm 116 and the capacitance value C2 of the second capacitor 123 satisfy the relationship described below, the voltage change amount dVm of the node B may be increased. First, the case where the signal charge is a hole will be described.

Hereinafter, for simplicity of description, it is assumed that the capacitance value C1 of the first capacitor Cm 116 is k-times larger than the capacitance value C2 of the second capacitor 123. Specifically, the capacitance values C1 and C2 have the relationship represented by Expression (5) below.

$$C1 = k \times C2 \quad (5)$$

As described above, the voltage change amount dVp of the node C and the voltage change amount dVm of the electrode D 112 (the node B) have the relationship represented by Expression (6) below.

$$dVm = dVp \times C1/(C1+C2) \quad (6)$$

Expression (7) below is obtained from Expressions (5) and (6).

$$dVm = dVp \times k/(1+k) \quad (7)$$

Here, to accumulate holes as the signal charge, the voltage Vs supplied to the upper electrode S 106 (the node A) and the reset voltage Vres satisfy the relationship represented by Expression (8) below.

$$Vs > Vres \quad (8)$$

To transfer the holes as the signal charge, the voltage Vs of the upper electrode S 106 (the node A), the reset voltage Vres, and the voltage change amount dVm of the electrode D 112 satisfy the relationship represented by Expression (9) below.

$$Vs < Vres + dVm \quad (9)$$

When the relationship of Expression (8) is satisfied, an inclination of a potential for drifting the holes toward the insulating layer 109 may be formed on the semiconductor layer 108. When the relationship of Expression (9) is satisfied, the inclination of the potential on the semiconductor layer 108 may be easily reversed.

Expression (10) below is obtained from Expressions (7) and (9).

$$Vs - Vres < dVp \times k/(1+k) \quad (10)$$

Here, in the case where the signal charge is a hole, the second voltage Vp2 is higher than the first voltage Vp1. Specifically, the voltage change amount dVp of the node C which is obtained by "Vp2−Vp1" is a positive value. Accordingly, even if both sides of Expression (10) are divided by dVp, the inequality sign is not reversed.

Accordingly, the relational expression represented by Expression (11) is obtained from Expression (10) for a capacitance rate k of the capacitance value C1 to the capacitance value C2.

$$1 - \frac{1}{1+k} > \frac{Vs - Vres}{dVp} \quad (11)$$

When the relationship represented by Expression (11) is satisfied, an amount of charge which is not discharged may be reduced. Accordingly, the noise may be reduced.

Specifically, the capacitance value C1 of the first capacitor Cm 116 is 4 fF and the capacitance value C2 of the second capacitor 123 is 1 fF in this embodiment. That is, k is 4. With this configuration, the noise may be reduced.

In this embodiment, the area Sd of an upper electrode 211 or a lower electrode 213 of the first capacitor Cm 116 and the area Ss of the electrode D 112 satisfy the following relationship in a plan view: Sd>0.5×Ss. With this configuration, the relationship of the capacitance rate described above may be easily obtained.

Furthermore, the larger a value of k is, the larger an effect of the noise reduction is. Accordingly, if the capacitance value C1 of the first capacitor Cm 116 is equal to or larger than the capacitance value C2 of the second capacitor 123, the noise reduction effect may be further enhanced.

The voltage change amount dVp of the node C is represented as follows using the first and second voltages Vp1 and Vp2: dVp=Vp2−Vp1. A left side of Expression (11) may be replaced by "C1/(C1+C2)" using Expression (5). Accordingly, Expression (11) is modified as Expression (12) below.

$$\frac{C1}{C1 + C2} > \frac{Vs - Vres}{Vp2 - Vp1} \quad (12)$$

Next, the case where the signal charge is an electron will be described. In the case where the signal charge is an electron, the inequality signs in Expressions (8) and (9) are reversed. Accordingly, the inequality sign in Expression (10) is also reversed. Specifically, in the case where the signal charge is an electron, Expression (13) below is obtained.

$$Vs - Vres > dVp \times k/(1+k) \quad (13)$$

However, in the case where the signal charge is an electron, the second voltage Vp2 is lower than the first voltage Vp1. Specifically, the voltage change amount dVp of the node C which is represented by "Vp2−Vp1" is a negative value. Accordingly, if both sides of Expression (13) are divided by dVp, the inequality sign is reversed. As a result, as with the case where the signal charge is a hole, Expressions (11) and (12) are obtained.

Here, the relationship represented by Expression (12) will be described. As the reset voltage Vres is closer to the voltage Vs supplied to the upper electrode S 106 of the light receiving region 101, a value of a right side becomes small. Specifically, the inclination of the potential of the semiconductor layer 108 may be reversed even if the capacitance value C1 of the first capacitor Cm 116 is small. If a difference between the reset voltage Vres and the voltage Vs supplied to the upper electrode S 106 is small, an amount of charge which may be accumulated in the semiconductor layer 108 is small.

On the other hand, the larger the difference between the reset voltage Vres and the voltage Vs is, the larger the value of the right side is. Specifically, a large value is set to the capacitance value C1 of the first capacitor Cm 116. Here, since the difference between the reset voltage Vres and the first voltage Vs1 is large, the amount of charge which may be accumulated in the semiconductor layer 108 may be increased.

As described above, the noise may be reduced in accordance with the relationship between the capacitance value C1 of the first capacitor Cm 116 and the capacitance value C2 of the second capacitor 123 included in the light receiving region 101.

Note that the numerical values described above are merely examples and the present invention is not limited to these values. A defect level may be detected in the interface between the semiconductor layer 108 and the insulating layer 109. In this case, a flat band voltage is taken into consideration based on a general technique.

Figure 8:
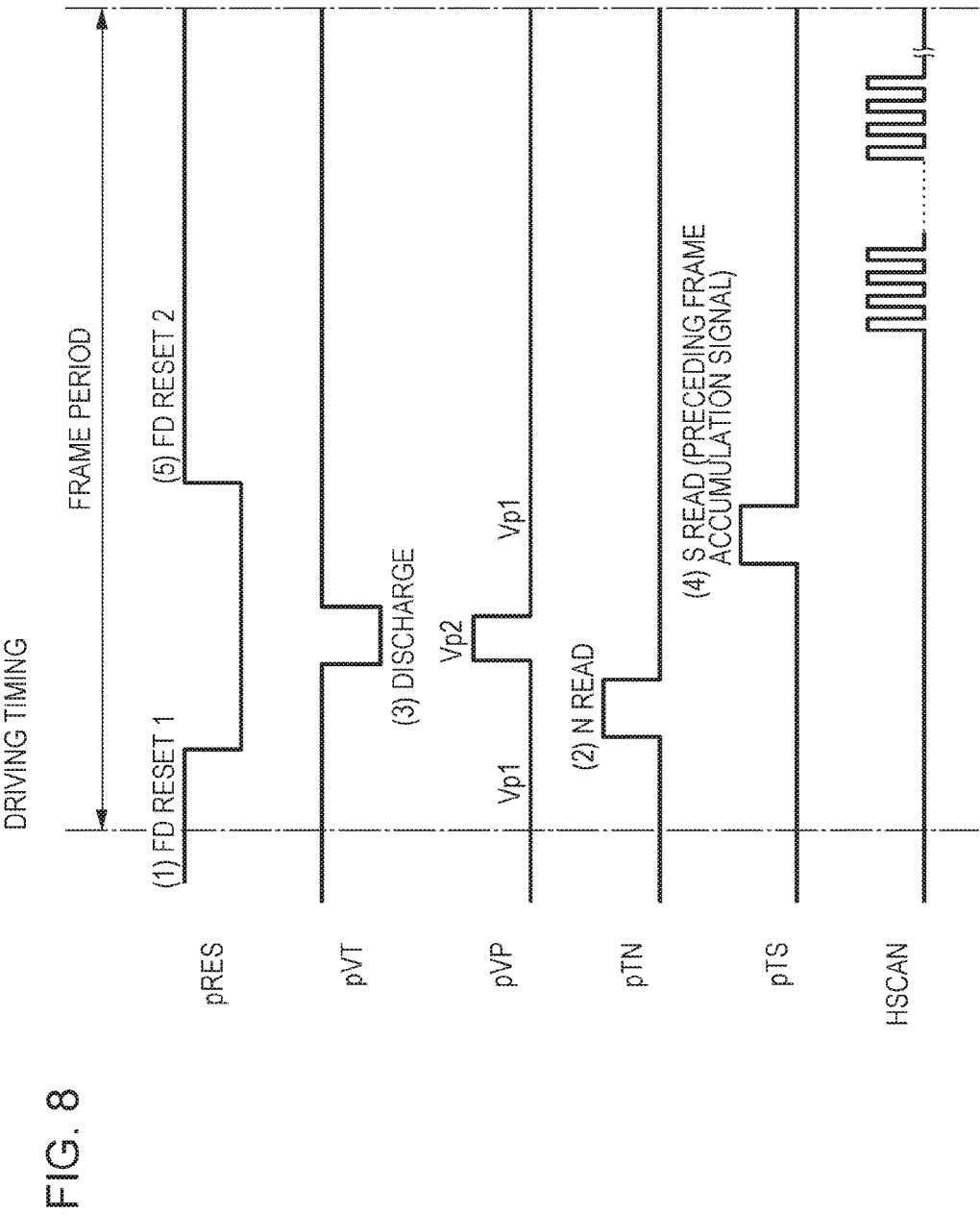
FIG. 8 is a timing chart illustrating driving signals used in the imaging apparatus.
Figure 9:
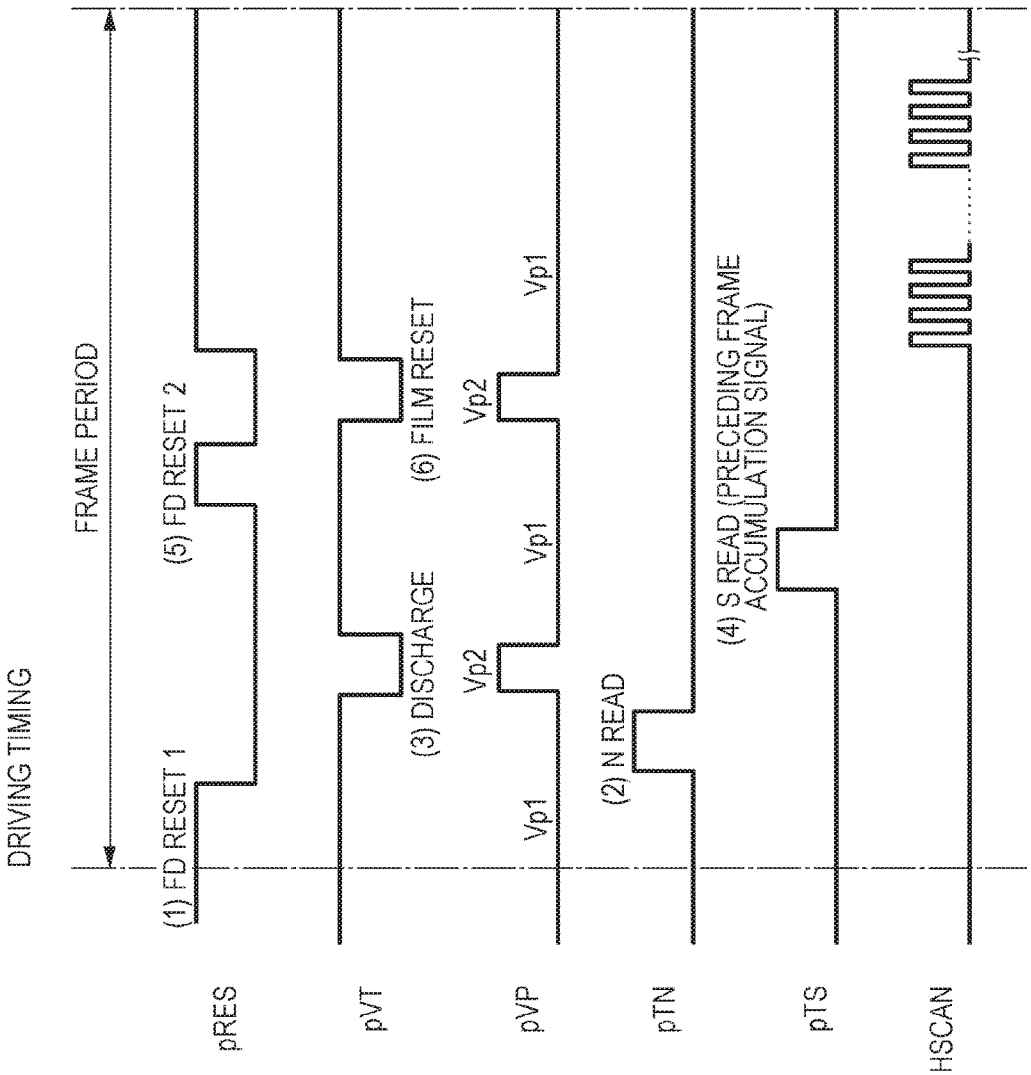
FIG. 9 is a timing chart illustrating driving signals used in the imaging apparatus.

Next, driving signals used for control of the imaging apparatus according to this embodiment will be described. FIGS. 8 and 9 are timing charts of driving signals used in the imaging apparatus of this embodiment. In FIGS. 8 and 9, the driving signals correspond to an operation of reading signals for one row.

The driving signal pRES is supplied to the gate of the reset transistor 117. A driving signal pVT is supplied to the transfer electrode T 111. A driving signal pTS is supplied to the S/H switch 302. A driving signal pTN is supplied to the S/H switch 303. A driving signal HSCAN is supplied to the column driving circuits 202.

When the driving signals pRES, pTN, and pTS are in a high level, corresponding transistors or corresponding switches are turned on. When the driving signals pRES, pTN, and pTS are in a low level, corresponding transistors or corresponding switches are turned off. The high level and the low level of the driving signals are set in accordance with threshold voltages of the transistors or the switches. In FIGS. 8 and 9, timing charts of the driving signal pVP is illustrated. The driving signal pVP includes the first and second voltages Vp1 and Vp2.

An operation using the driving signals illustrated in FIG. 8 will now be described. First, the driving signal pRES is in a high level, and therefore, the voltage of the electrode P 110 is reset to the reset voltage Vres. Thereafter, the driving signal pRES is brought into a low level, and therefore, the reset transistor 117 is turned off and the node (the node B) including the electrode P 110 is floated. When the driving signal pTN is brought into a high level, the S/H switch 303 is turned on. By this, the noise signal N is held. Subsequently, the driving signal pVT is brought into a low level, and therefore, the potential barrier between the light receiving region 101 and the charge discharging region 103 is removed. Meanwhile the power source VP 113 supplies the second voltage Vp2. By this, signal charge is transferred. Thereafter, the driving signal pTS is brought into a high level, and therefore, the S/H switch 302 is turned on. By this, the optical signal S is held. Thereafter, the driving signal pRES is brought into a high level, and therefore, the voltage of the electrode P 110 is reset again.

In the operation using the driving signals illustrated in FIG. 9, a film reset is performed before accumulation of signal charge is started. Specifically, an operation similar to the transfer of charge is performed after the driving signal pTS is brought into a low level. According to the driving described above, residual charge may be reduced before exposure is started. Consequently, noise, such as an image lag, may be reduced.

As described above, according to this embodiment, charge is transferred from the light receiving region 101 of the semiconductor layer 108 to the charge discharging region 103 of the semiconductor layer 108 in a direction parallel to the surface of the substrate including the pixel circuit disposed thereon. With this configuration, charge may be transferred in a short time. Consequently, noise may be reduced.

Second Embodiment

Figure 10:
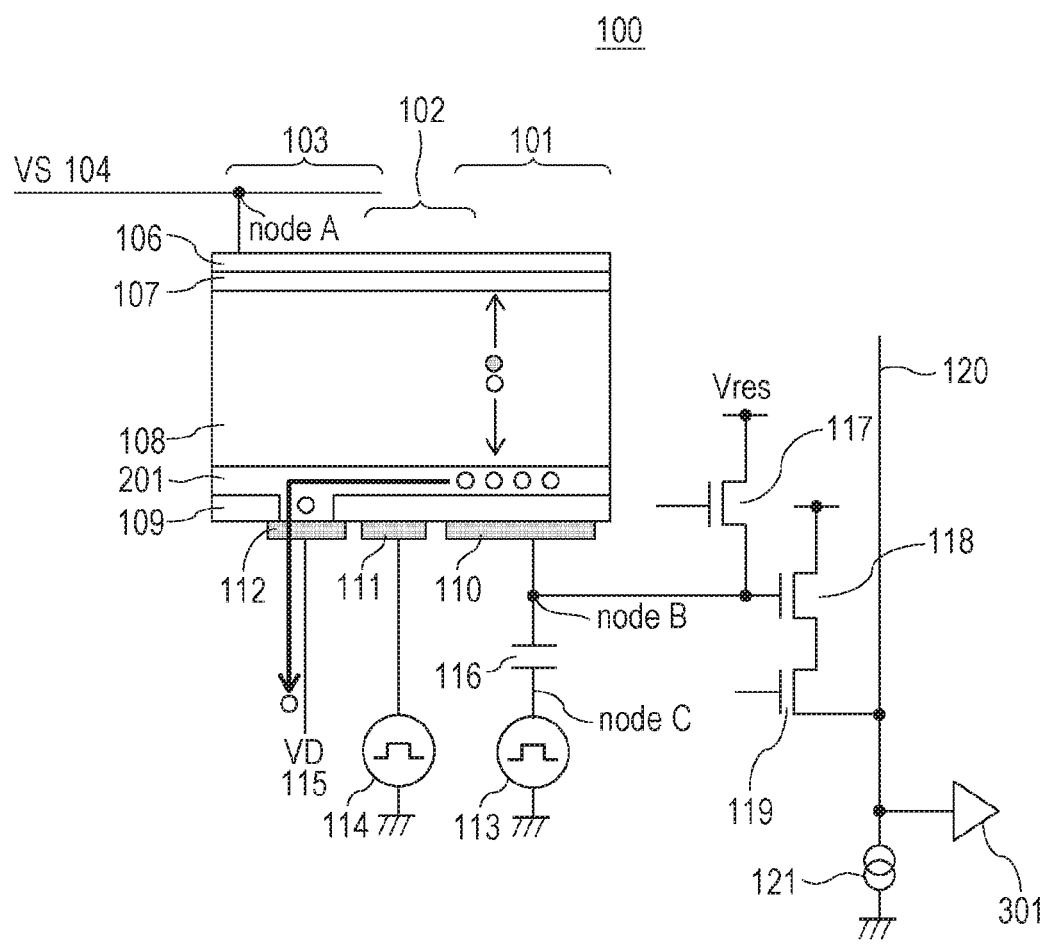
FIG. 10 is a diagram schematically illustrating a configuration of a pixel of an imaging apparatus.

A second embodiment will be described. FIG. 10 is a diagram schematically illustrating a configuration of a pixel of an imaging apparatus. Portions the same as those of the first embodiment are denoted by reference numerals the same as those of the first embodiment. The second embodiment is different from the first embodiment in that a charge confining layer 201 is disposed between a semiconductor layer 108 and an insulating layer 109. Portions different from the first embodiment will be described hereinafter.

The charge confining layer 201 may be formed of a semiconductor material having a band gap which is different from that of the semiconductor layer 108. A so-called heterostructure is employed in the semiconductor layer 108 and the charge confining layer 201. The charge confining layer 201 has a function of confining, or enclosing, accumulated holes in a certain region or a certain transfer path. Therefore, as illustrated in FIG. 10, holes which are signal charge are accumulated in the charge confining layer 201. Then the signal charge is transferred in a direction parallel to a surface of a substrate including a pixel circuit disposed thereon in the charge confining layer 201. Thus, the charge confining layer 201 may be called a charge transferring layer.

In a case where both of the blocking layer 107 and the charge confining layer 201 are disposed, the blocking layer 107 and the charge confining layer 201 block charge of different polarities. In this embodiment, the blocking layer 107 blocks intrusion of holes from an upper electrode S 106 to the semiconductor layer 108. The charge confining layer 201 blocks intrusion of electrons to the semiconductor layer 108. Note that only the insulating layer 109 is disposed below the charge confining layer 201, and therefore, the charge confining layer 201 may not block the intrusion of electrons.

Figure 11:
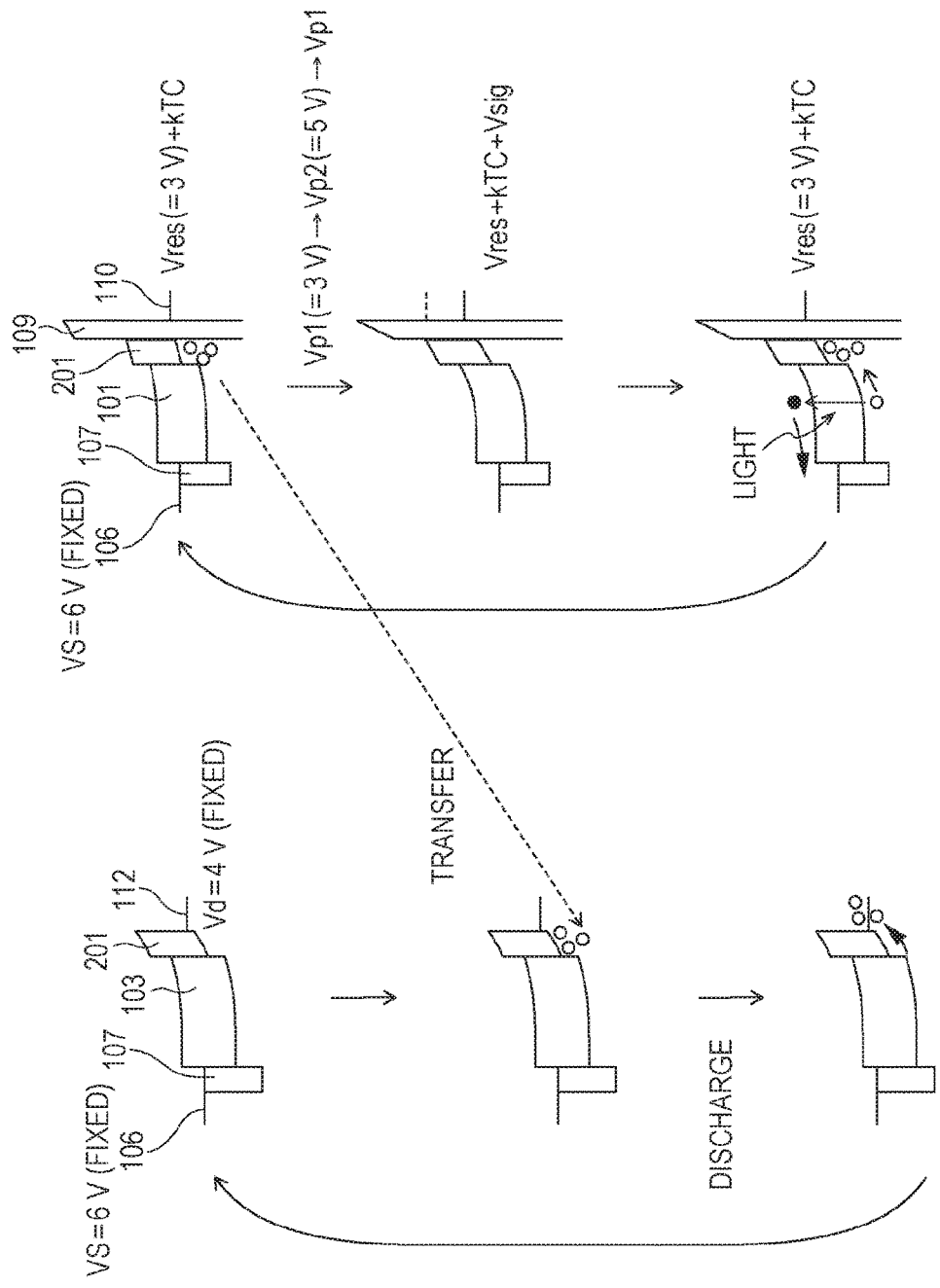
FIG. 11 is a diagram schematically illustrating an energy band of a photoelectric conversion unit of the imaging apparatus.

FIG. 11 is a diagram schematically illustrating a potential in a vertical direction in the imaging apparatus illustrated in FIG. 10. An operation of this embodiment is the same as the operation of the first embodiment described with reference to FIGS. 6A to 6F and FIG. 7. However, since the charge confining layer 201 is disposed, signal charge is accumulated in the charge confining layer 201 as illustrated in FIG. 11, and charge transfer is performed in the charge confining layer 201. With this configuration, transfer of charge may be realized at higher speed.

Note that, for the sake of description, the semiconductor layer 108 and the charge confining layer 201 are individually illustrated. However, different portions of a single semiconductor region may function as the semiconductor layer 108 and the charge confining layer 201. For example, the different portions may have different impurity concentrations.

As described above, the charge confining layer 201 has a function of confining, or enclosing, accumulated holes in a certain region or a certain transfer path. The holes which are signal charge are accumulated in the charge confining layer 201, and then are transferred, within the charge confining layer 201, in a direction parallel to a surface of a substrate including a pixel circuit disposed thereon.

In the embodiments, the semiconductor layer 108 is typically designed to enlarge a carrier lifetime in order to improve a sensitivity of the light receiving region 101 of the semiconductor layer 108. However, enlarging the carrier lifetime may lead to a decrease in mobility of the carrier. As a result, response speed may decrease.

An inorganic material or an organic material is used for the semiconductor layer 108 of the present embodiment. The semiconductor layer 108 formed of the inorganic material is, for example, a hydrogenated amorphous silicon film or a film including a quantum dot of a IV-VI compound semiconductor, such as PbS, PbTe and CuO. Examples of the organic material used for the semiconductor layer 108 includes a Buckminster-fullerene, coumalin 6 (C6), rhodamine 6G (R6G), zinc phthalocyanine (ZnPc), quinacridone, a phthalocyanine compound, and a naphthalocyanine compound.

If the above materials are made to enlarge the carrier lifetime, the mobility of the carrier may become less than 1 $cm^2/Vs$. In such a case, a material having a high carrier mobility is optionally used as the charge confining layer 201. The charge confining layer 201 having a high carrier mobility can improve the carrier transferring speed.

Specifically, a different material from the material used for the semiconductor layer 108 is used to form the charge confining layer 201. For example, a grapheme sheet, a layer including a quantum dot of HgSe, a layer including a quantum dot of HgTe or a layer including a quantum dot of CdSe is used. These materials have a carrier mobility greater than or equal to 1 $cm^2/Vs$. The mobility of the carrier in the grapheme sheet is typically about 60,000 $cm^2/Vs$. The mobility of the carrier in the layer including a quantum dot of HgSe is typically about 100 $cm^2/Vs$. The mobility of the carrier in the layer including a quantum dot of HgTe is typically about 1 $cm^2/Vs$. The mobility of the carrier in the layer including a quantum dot of CdSe is typically about 10 $cm^2/Vs$.

The graphene sheet has a comparatively high mobility while it is difficult to form the graphene sheet separated in pixel basis.

A layer including a quantum dot is, for example, made of a semiconductor material. Accordingly, it is easy to perform a complete depletion. As a result, using a layer including a quantum dot can reduce a noise while achieving high charge transferring speed. Typically, the charge confining layer 201 having a carrier mobility greater than or equal to about 1 $cm^2/Vs$ is used in order to transfer the charge in a period short enough for high speed image sensor. The layer including the quantum dot may have an advantage that it is easy to stack the semiconductor layer 108 including a quantum dot.

As explained above, the image sensor according to the present embodiment can improve sensitivity of the light receiving region 103 while achieving a high-speed signal readout.

Third Embodiment

A third embodiment according to the present invention will now be described. The third embodiment is different from the first embodiment in that the charge transfer region 102, the transfer electrode T 111, and the power source VT 114 connected to the transfer electrode T 111 are eliminated. Portions different from the first embodiment will be described hereinafter.

Figure 12:
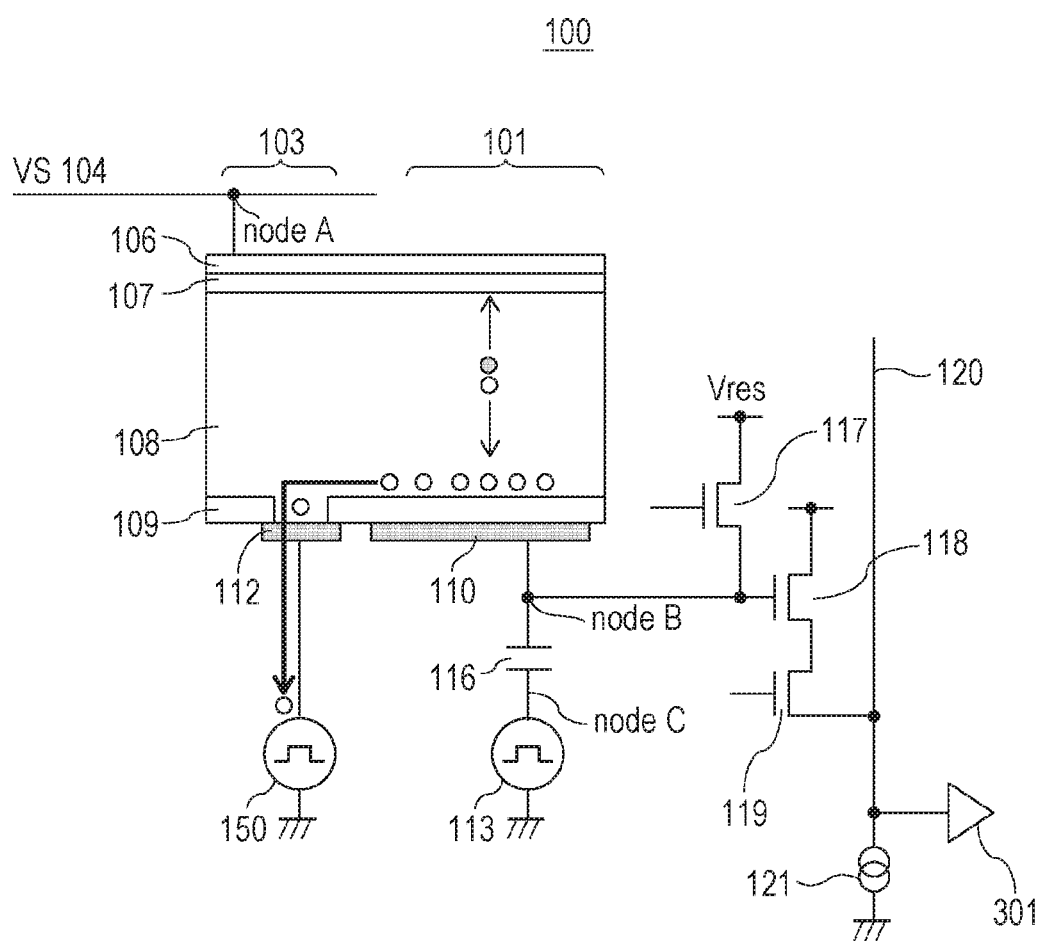
FIG. 12 is a diagram schematically illustrating a configuration of a pixel of an imaging apparatus.

FIG. 12 is a diagram schematically illustrating a pixel 100 of an imaging apparatus according to this embodiment. Portions having functions the same as those of FIG. 1A are denoted by reference numerals the same as those of FIG. 1A. As illustrated in FIG. 12, the pixel 100 does not include the charge transfer region 102, the transfer electrode T 111, and the power source VT 114.

In the pixel 100 of this embodiment, a power source VD 150 connected to an electrode D 112 supplies different voltages to the electrode D 112. Transfer of charge from a light receiving region 101 to a charge discharging region 103 may be performed by controlling a voltage Vd supplied from the power source VD 150 and a voltage Vp supplied from a power source VP 113. Note that a voltage Vm of an electrode P 110 is changed in accordance with a change of the voltage Vp.

In a case where signal charge is a hole, the relationship between the voltage Vm of the electrode P 110 and the voltage Vd of the electrode D 112 is set to satisfy "Vd<Vm" so that charge is transferred from the light receiving region 101 to the charge discharging region 103. Note that, in a period of time in which the light receiving region 101 accumulates charge, the relationship between the voltage Vm of the electrode P 110 and the voltage Vd of the electrode D 112 is set as follows: Vd>Vm. In a case where the signal charge is an electron, the relationship between the voltage Vm of the electrode P 110 and the voltage Vd of the electrode D 112 is set to satisfy "Vd>Vm" so that charge is transferred from the light receiving region 101 to the charge discharging region 103. Note that, in the period of time in which the light receiving region 101 accumulates charge, the relationship between the voltage Vm of the electrode P 110 and the voltage Vd of the electrode D 112 is set as follows: Vm>Vd.

Figure 13:
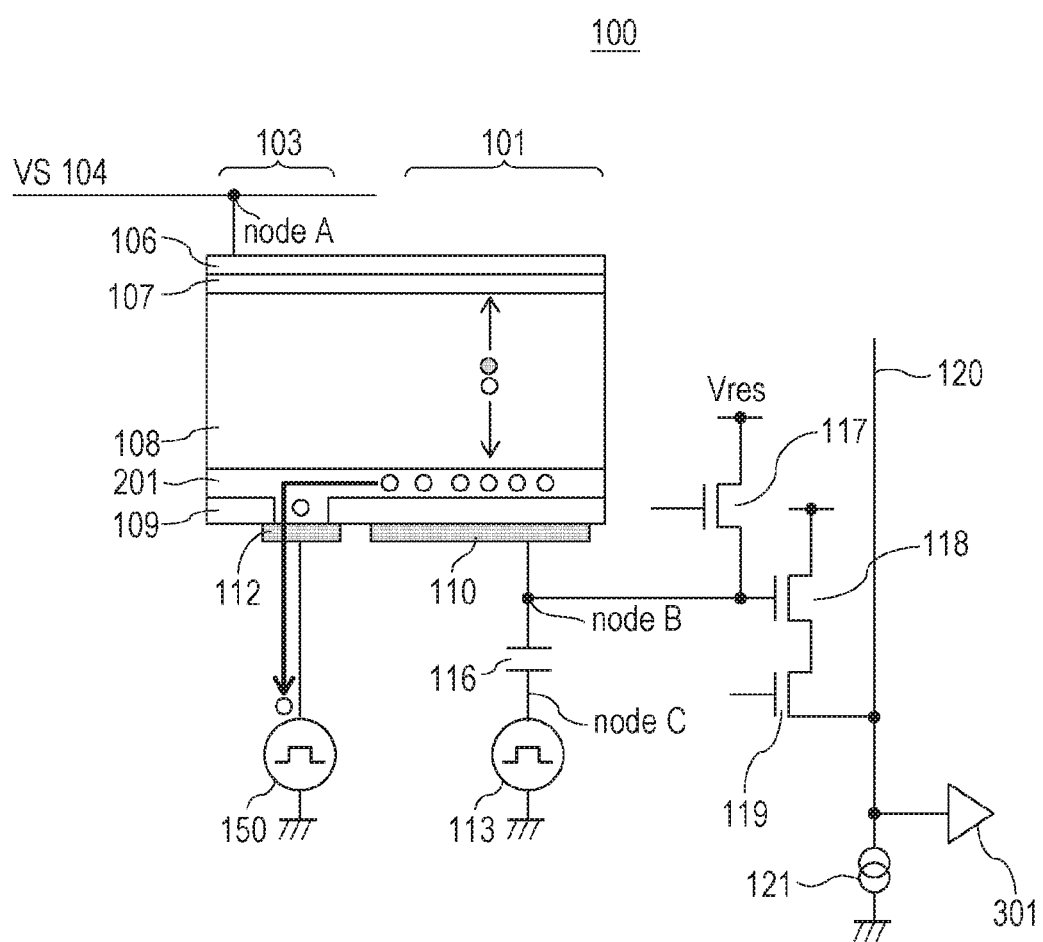
FIG. 13 is a diagram schematically illustrating a configuration of a pixel of an imaging apparatus.

As illustrated in FIG. 13, the imaging apparatus of this embodiment may include a charge confining layer 201. A configuration and a function of the charge confining layer 201 are the same as those of the second embodiment.

As described above, the pixel 100 does not include the charge transfer region 102 in this embodiment. With this configuration, a pixel size may be reduced.

Fourth Embodiment

A fourth embodiment of the present invention will now be described. The fourth embodiment is different from the first embodiment in that signal charge accumulated in a light receiving region 101 is transferred to a charge reading region 410. Portions different from the first embodiment will be described hereinafter.

Figure 14:
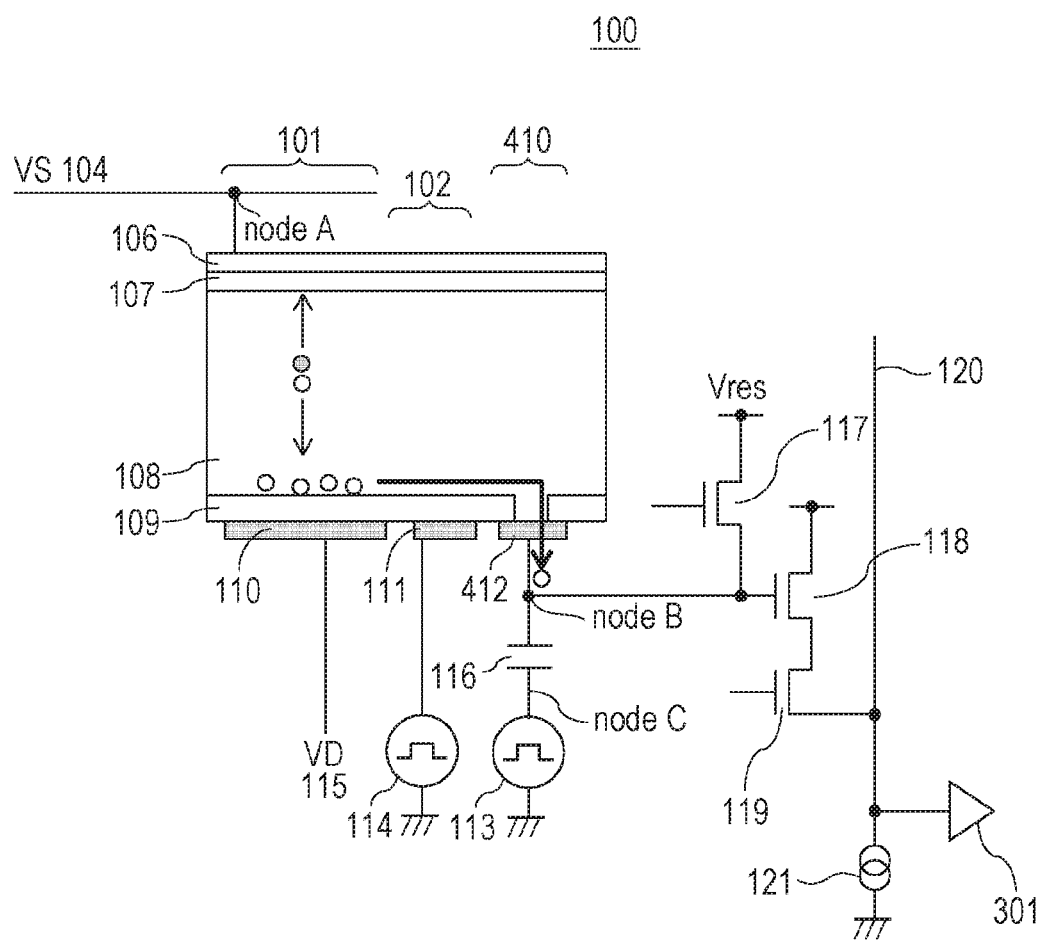
FIG. 14 is a diagram schematically illustrating a configuration of a pixel of an imaging apparatus.

FIG. 14 is a diagram schematically illustrating a pixel 100 of an imaging apparatus according to this embodiment. Portions having functions the same as those of FIG. 1A are denoted by reference numerals the same as those of FIG. 1A. In this embodiment, a semiconductor layer 108 includes the charge reading region 410. An electrode M 412 is connected to the charge reading region 410. Furthermore, the charge reading region 410 is electrically connected to a gate of an amplification transistor 118 and a first capacitor Cm 116 through the electrode M 412. Meanwhile, a fixed voltage Vd is supplied to an electrode P 110.

Signal charge accumulated in the light receiving region 101 is transferred from the light receiving region 101 to the charge reading region 410 in a direction parallel to a surface of a substrate including a pixel circuit disposed thereon. Since the charge reading region 410 is connected to the gate of the amplification transistor 118, the transferred charge is converted into a voltage signal by charge-voltage conversion performed in a node B.

A charge transfer region 102 is defined between the light receiving region 101 and the charge reading region 410. Accordingly, although a configuration of a connection between the electrode and the pixel circuit is different from that of the first embodiment, configurations and functions of the light receiving region 101 and the charge reading region 410 are similar to those of the light receiving region 101 and the charge discharging region 103 of the first embodiment.

Figure 15:
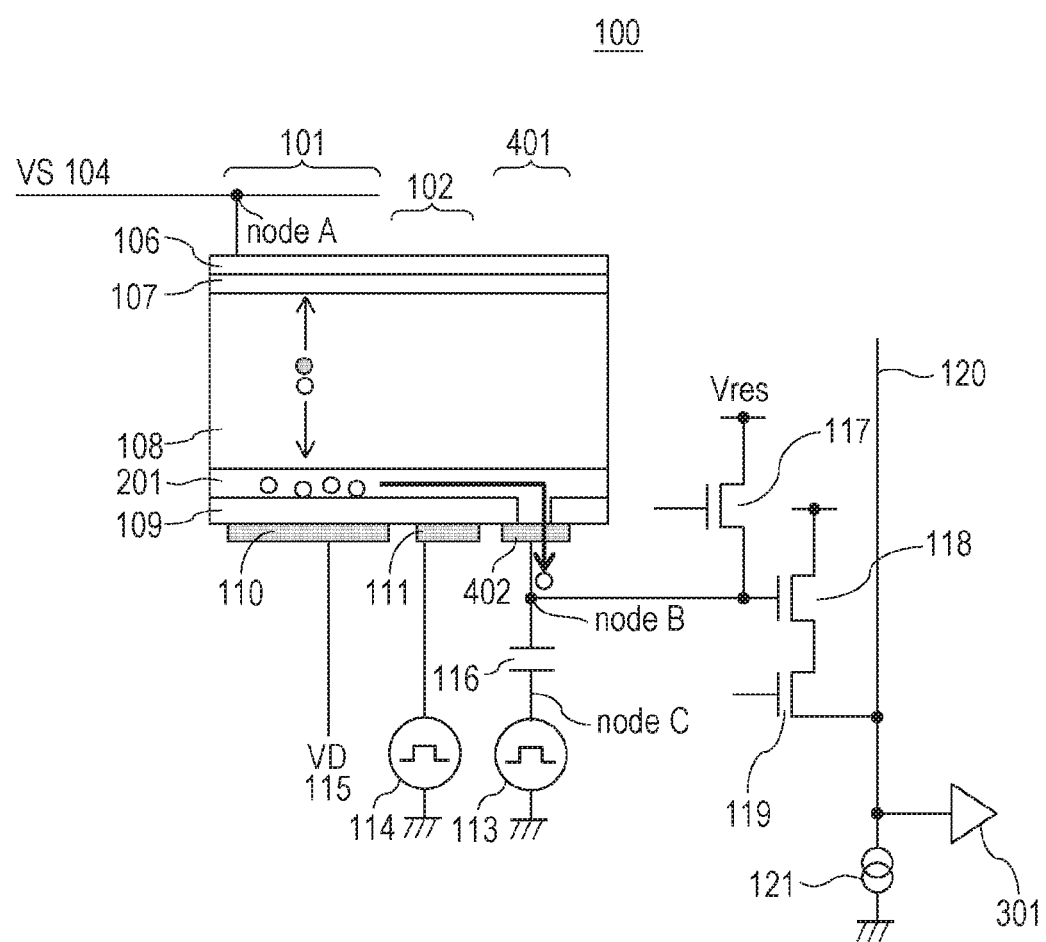
FIG. 15 is a diagram schematically illustrating a configuration of a pixel of an imaging apparatus.

Note that the charge transfer region 102 may be eliminated as with the second embodiment. Furthermore, as illustrated in FIG. 15, the imaging apparatus of this embodiment may include a charge confining layer 201.

As described above, according to this embodiment, charge is transferred from the light receiving region 101 of the semiconductor layer 108 to the charge reading region 410 of the semiconductor layer 108 in a direction parallel to a surface of a substrate including a pixel circuit disposed thereon. With this configuration, the charge may be transferred in a short time. Consequently, noise may be reduced.

Fifth Embodiment

A fifth embodiment of the present invention will now be described. The fifth embodiment is different from the first embodiment in that a plurality of light receiving regions 101 share a charge discharging region 103. Portions different from the first embodiment will be described hereinafter.

Figure 16A:
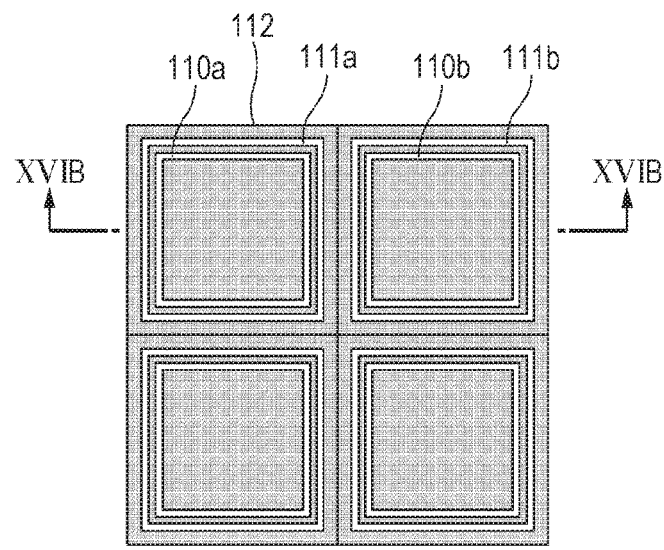
FIG. 16A is a diagram schematically illustrating a planar structure of an imaging apparatus.
Figure 16B:
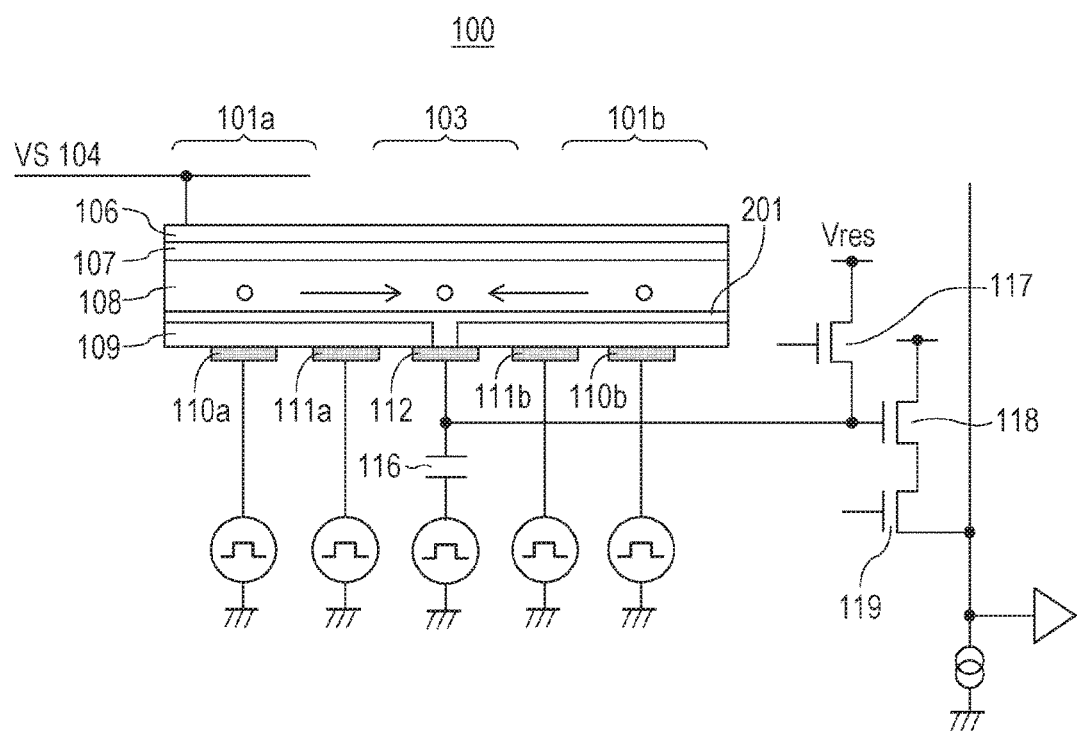
FIG. 16B is a diagram schematically illustrating a configuration of a pixel of the imaging apparatus.

FIG. 16A is a diagram schematically illustrating a planar structure of an imaging apparatus. FIG. 16B is a diagram schematically illustrating a pixel 100 of the imaging apparatus according to this embodiment. A cross section of FIG. 16B is obtained taken along a dotted line XVIB to XVIB of FIG. 1A. In FIGS. 16A and 16B, alphabets are assigned after reference numerals so as to distinguish the plurality of light receiving regions 101 from one another. The same is true on a plurality of electrodes P 110 and a plurality of transfer electrodes T111.

In this embodiment, charge of a light receiving region 101a and charge of a light receiving region 101b are both transferred to a charge discharging region 103. In other words, the plurality of light receiving regions 101 are disposed for one pair of a pixel circuit and the charge discharging region 103. Accordingly, a plurality of signals of the plurality of light receiving regions 101 may be read from the common pixel circuit. Alternatively, charges from the plurality of light receiving regions 101 may be added to one another in the charge discharging region 103. Note that, in a modification of this embodiment, the charge confining layer 201 is omitted.

Sixth Embodiment

A sixth embodiment of the present invention will now be described. The sixth embodiment is different from the third embodiment in that an electrode P 110 and an electrode D 112 are disposed in different heights. Hereinafter, portions different from the third embodiment will be described hereinafter.

Figure 17:
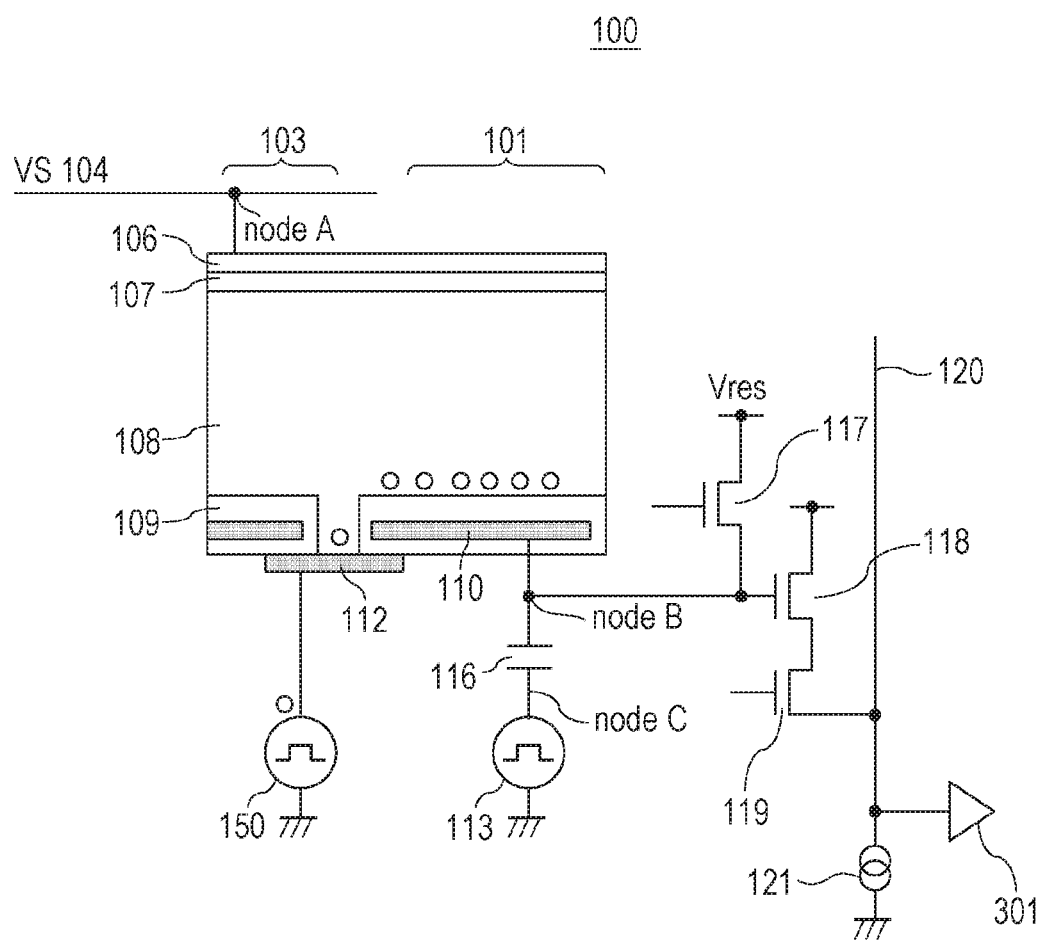
FIG. 17 is a diagram schematically illustrating a configuration of a pixel of an imaging apparatus.

FIG. 17 is a diagram schematically illustrating a pixel 100 of an imaging apparatus according to this embodiment. Portions having functions the same as those of FIG. 1A are denoted by reference numerals the same as those of FIG. 1A.

As illustrated in FIG. 17, the electrode P 110 and the electrode D 112 are disposed in different heights. A surface of a substrate including a pixel circuit disposed thereon serves as a reference of the heights. Specifically, the electrode P 110 and the electrode D 112 are disposed in different positions having different distances from the substrate in a second direction which is vertical to the surface of the substrate. In other words, the electrode P 110 and the electrode D 112 are formed in different layers. The different layers may be two metal layers with an interlayer insulating film interposed therebetween.

Furthermore, a portion of the electrode P 110 and a portion of the electrode D 112 may overlap with each other as illustrated in FIG. 17. An insulating layer is disposed between the overlapping portions.

In FIG. 17, the entire electrode P 110 and the entire electrode D 112 are disposed in different heights. Note that at least a portion of the electrode P 110 and a portion of the electrode D 112 may be disposed in different heights.

With this configuration, charge may be stably transferred. Accordingly, an amount of residual charge in the light receiving region 101 may be reduced, and as a result, noise may be reduced.

As with the first embodiment, the imaging apparatus of this embodiment may include a charge transfer region 102 and a transfer electrode T 111. As with the second embodiment and the like, the imaging apparatus of this embodiment may include a charge confining layer 201. Furthermore, at least a portion of the electrode P 110 and at least a portion of the transfer electrode T 111 may be disposed in different heights.

Seventh Embodiment

A seventh embodiment of the present invention will now be described. The seventh embodiment is different from the first embodiment in that a plurality of electrodes are separately disposed on a semiconductor layer 108. Portions different from the first embodiment will be described hereinafter.

Figure 18:
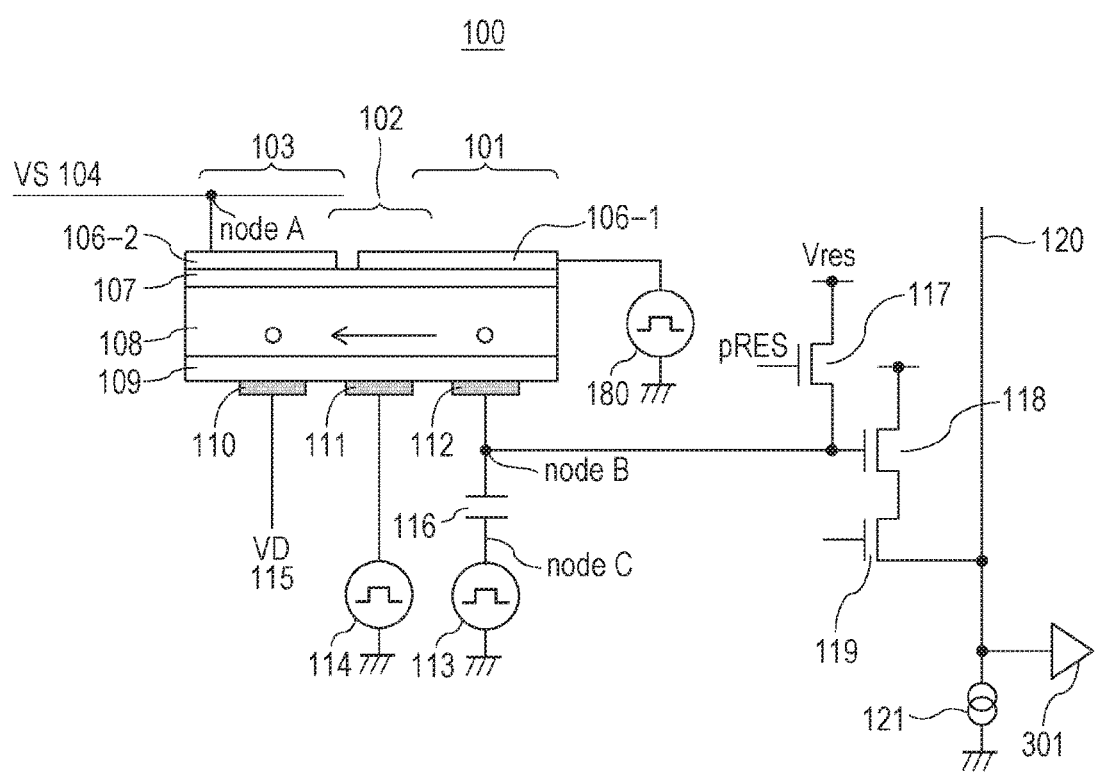
FIG. 18 is a diagram schematically illustrating a configuration of a pixel of an imaging apparatus.

FIG. 18 is a diagram schematically illustrating a pixel 100 of an imaging apparatus according to this embodiment. Portions having functions the same as those of FIG. 1A are denoted by reference numerals the same as those of FIG. 1A. In the imaging apparatus illustrated in FIG. 18, an upper electrode S 106 is not disposed on a charge transfer region 102. Therefore, the upper electrode S 106 includes a portion disposed on a light receiving region 101 (a first electrode) and a portion disposed on a charge discharging region 103 (a third electrode) which are separated from each other. The two separated portions of the upper electrode S 106 are referred to as a "first electrode 106-1" and a "third electrode 106-2".

The light receiving region 101 is defined between the first electrode 106-1 and an electrode D 112 (a fourth electrode). The charge discharging region 103 is defined between the third electrode 106-2 and an electrode P 110 (a second electrode). A power source VSB 180 is connected to the first electrode 106-1. The power source VSB 180 supplies a plurality of voltages Vsb to the first electrode 106-1. As with the upper electrode S 106 of the first embodiment, a power source VS 104 is connected to the third electrode 106-2.

When a hole which is signal charge is transferred from the light receiving region 101 to the charge discharging region 103, the voltage Vsb of the first electrode 106-1 and the voltage Vs of the third electrode 106-2 satisfy the following relationship: Vsb<Vs. Accordingly, the transfer of the charge by the electrode P 110, the transfer electrode T 111, and the electrode D 112 may be supported. Consequently, the transfer of charge may be performed at higher speed. In a case where the signal charge is an electron, when the charge is transferred, the voltage Vsb of the first electrode 106-1 and the voltage Vs of the third electrode 106-2 satisfy the following relationship: Vsb>Vs. Accordingly, the transfer of the charge by the electrode P 110, the transfer electrode T 111, and the electrode D 112 may be supported. Consequently, the transfer of the charge may be performed at higher speed.

The two separated portions on the upper electrode S 106 may be insulated from each other or connected to each other. Since the charge discharging region 103 may not receive light, a portion disposed on the charge discharging region 103 (the third electrode) may be formed of metal, and the metal may be connected to a portion disposed on the light receiving region 101 (the first electrode). With this configuration, a resistance of a line which supplies the voltage Vs may be effectively reduced.

Furthermore, another electrode which is separated from the first electrode 106-1 and the third electrode 106-2 may be disposed between the first electrode 106-1 and the third electrode 106-2. Specifically, an electrode which may be independently controlled may be disposed in the charge transfer region 102. In this case, an electric field formed by the transfer electrode T 111 and the other electrode may prevent leakage of charge accumulated in the light receiving region 101 to an outside.

As described above, according to this embodiment, the upper electrode S 106 includes the portion disposed on the light receiving region 101 (the first electrode) and the portion disposed on the charge discharging region 103 (the third electrode) which are separated from each other. With this configuration, a charge transfer efficiency may be improved.

Eighth Embodiment

Figure 19:
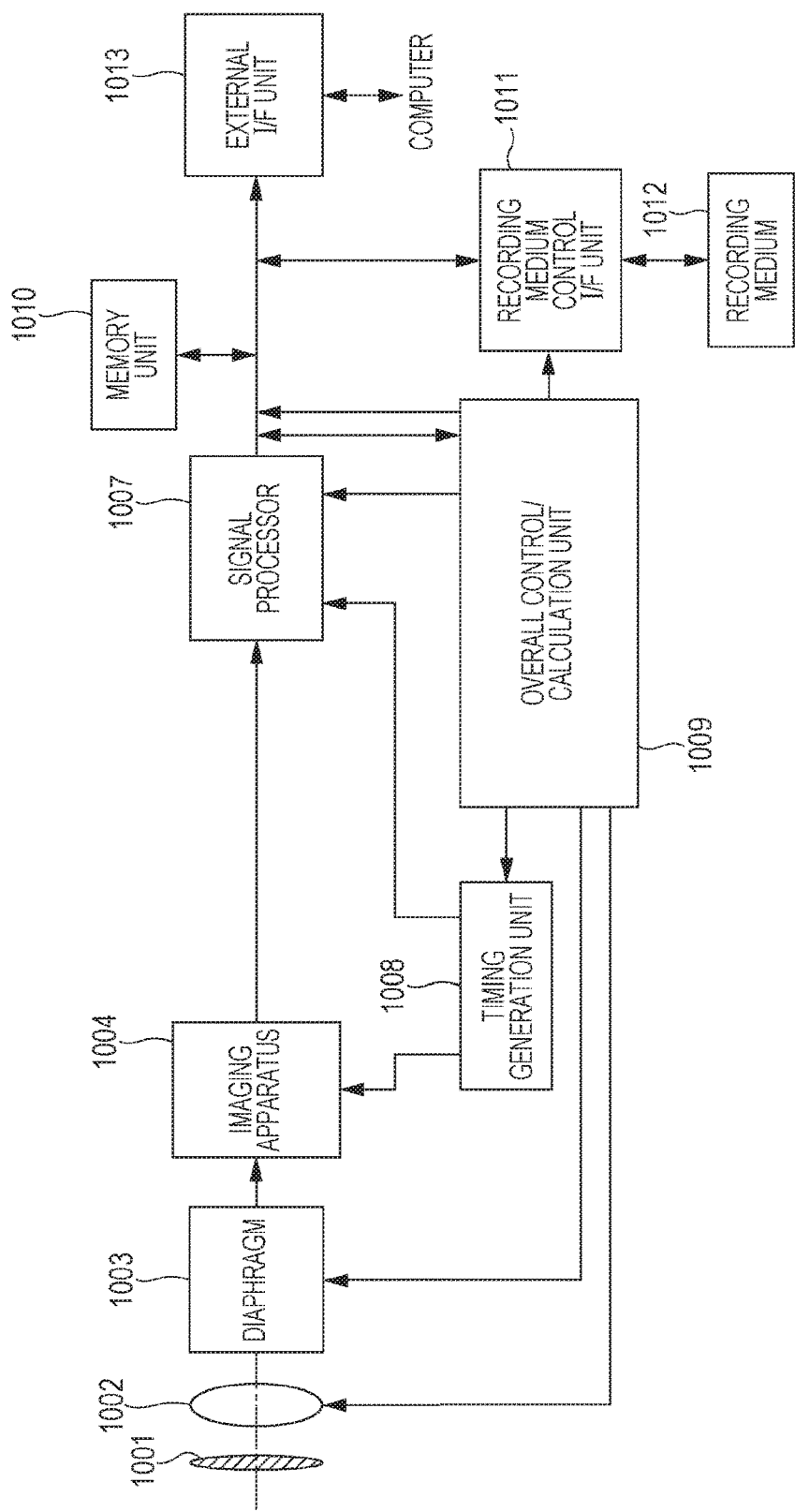
FIG. 19 is a block diagram illustrating a photoelectric conversion system according to an embodiment.

An embodiment of an imaging system according to the present invention will be described. Examples of the imaging system include a digital still camera, a digital camcorder, a camera head, a photocopier, a facsimile, a cellular phone, a car-mounted camera, and an observatory. FIG. 19 is a block diagram illustrating a digital still camera which is an example of the imaging system.

In FIG. 19, the imaging system includes a barrier 1001 which protects a lens, a lens 1002 which forms an optical image of a subject on an imaging apparatus 1004, and a diaphragm 1003 which changes an amount of light which passes the lens 1002. The imaging apparatus 1004 corresponds to the imaging apparatuses described above in the foregoing embodiments, and converts the optical image formed by the lens 1002 into image data. It is assumed that the imaging apparatus 1004 has a semiconductor substrate including an AD conversion unit formed thereon. A signal processor 1007 performs various correction operations on imaging data output from the imaging apparatus 1004 and compresses data. In FIG. 19, a timing generation unit 1008 outputs various timing signals to the imaging apparatus 1004 and the signal processor 1007, and an overall control/calculation unit 1009 controls the entire digital still camera. A frame memory unit 1010 temporarily stores image data, an interface unit 1011 is used to perform recording and reading on a recording medium, and a detachable recording medium 1012, such as a semiconductor memory, is subjected to recording or reading of imaging data. An interface unit 1013 is used to communicate with external computers or the like. Here, the timing signals may be input from an outside of the imaging system, and the imaging system at least includes the imaging apparatus 1004 and the signal processor 1007 which processes an imaging signal output from the imaging apparatus 1004.

In this embodiment, the configuration in which the imaging apparatus 1004 and the AD conversion unit are disposed in the same semiconductor substrate is described. However, the imaging apparatus 1004 and the AD conversion unit may be formed on different semiconductor substrates. Furthermore, the imaging apparatus 1004 and the signal processor 1007 may be formed on the same semiconductor substrate.

Furthermore, each of pixels 100 may include a first photoelectric conversion unit 101A and a second photoelectric conversion unit 101B. The signal processor 1007 may process a signal based on charge generated in the first photoelectric conversion unit 101A and a signal based on charge generated in the second photoelectric conversion unit 101B so as to obtain information on a distance from the imaging apparatus 1004 to a subject.

In the embodiment of the imaging system, the imaging apparatus according to the first embodiment is used as the imaging apparatus 1004. Since the embodiment of the present invention is employed in the imaging system, an image having reduced noise may be obtained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-237869, filed Dec. 4, 2015 and Japanese Patent Application No. 2016-154616, filed Aug. 5, 2016, which are hereby incorporated by reference herein in their entirety.

What is claimed is:

1. An imaging apparatus comprising:
   a substrate including a plurality of pixel circuits;
   first, second, third, and fourth electrodes disposed on the substrate; and
   a semiconductor layer disposed on the substrate and including a first portion and a second portion,
   wherein
   the first portion is disposed between the first electrode and the second electrode and is formed vertically above the second electrode and within a boundary of the second electrode,
   the second portion is disposed between the third electrode and fourth electrode and is formed vertically above the fourth electrode and within a boundary of the fourth electrode,
   each of the plurality of pixel circuits includes an amplification transistor configured to output a signal based on charge generated in the semiconductor layer, and
   the charge generated in the semiconductor layer is accumulated in the first portion, and thereafter transferred from the first portion to the second portion in a first direction parallel to a surface of the substrate.

2. The imaging apparatus according to claim 1, further comprising an insulating layer disposed between the first portion and the second electrode in the semiconductor layer.

3. The imaging apparatus according to claim 2, further comprising a charge confining layer disposed between the semiconductor layer and the insulating layer.

4. The imaging apparatus according to claim 3, wherein the charge confining layer extends to a region disposed between the second portion and the fourth electrode in the semiconductor layer.

5. The imaging apparatus according to claim 4, wherein the charge confining layer is disposed in contact with the fourth electrode.

6. The imaging apparatus according to claim 3, wherein a mobility of the charge in the charge confining layer is greater than a mobility of the charge in the semiconductor layer.

7. The imaging apparatus according to claim 6, wherein the mobility of the charge in the charge confining layer is greater than or equal to 1 cm$^2$/Vs.

8. The imaging apparatus according to claim 7, wherein the mobility of the charge in the semiconductor layer is less than 1 cm$^2$/Vs.

9. The imaging apparatus according to claim 8, wherein the charge confining layer includes at least one selected from a group that consists of a graphene sheet, a layer including a quantum dot of HgSe, a layer including a quantum dot of HgTe and a layer including a quantum dot of CdSe.

10. The imaging apparatus according to claim 2, wherein the second portion of the semiconductor layer is disposed in contact with the fourth electrode.

11. The imaging apparatus according to claim 1, wherein the second electrode is electrically connected to the amplification transistor.

12. The imaging apparatus according to claim 1, wherein the fourth electrode is electrically connected to the amplification transistor.

13. The imaging apparatus according to claim 1, wherein the first electrode and the third electrode are separated from each other.

14. The imaging apparatus according to claim 1, wherein the first electrode and the third electrode are formed in a continuous conductive layer.

15. The imaging apparatus according to claim 1, wherein the fourth electrode surrounds the second electrode in a plane parallel to the surface of the substrate.

16. The imaging apparatus according to claim 6, wherein the fourth electrode surrounds the second electrode in a plane which is parallel to the surface of the substrate.

17. The imaging apparatus according to claim 1,
wherein the semiconductor layer includes a transfer region disposed between the first portion and the second portion, and
wherein a transfer electrode is disposed to control a potential of the transfer region.

18. The imaging apparatus according to claim 17, wherein at least a portion of the second electrode and at least a portion of the transfer electrode are disposed at positions having different distances from the substrate in a second direction vertical to the surface of the substrate.

19. The imaging apparatus according to claim 1, wherein at least a portion of the second electrode and at least a portion of the fourth electrode are disposed at positions having different distances from the substrate in a second direction vertical to the surface of the substrate.

20. An imaging system comprising:
the imaging apparatus according to claim 1; and
a signal processor which processes a signal output from the imaging apparatus.

21. The imaging apparatus according to claim 1, wherein the charge generated in the semiconductor layer is accumulated in the first portion by transferred in a direction crossing the surface of the substrate, and thereafter is transferred from the first portion to the second portion in the first direction which is different from the direction crossing the surface of the substrate.

* * * * *